US006757854B1

(12) United States Patent
Zhao et al.

(10) Patent No.: US 6,757,854 B1
(45) Date of Patent: Jun. 29, 2004

(54) DETECTING FAULTS IN DUAL PORT FIFO MEMORIES

(75) Inventors: Jun Zhao, Whitehall, PA (US); Mukesh Puri, Fremont, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/397,542

(22) Filed: Sep. 16, 1999

(51) Int. Cl.[7] .............................................. G11C 29/00
(52) U.S. Cl. ..................................................... 714/719
(58) Field of Search ................................ 714/718, 719

(56) References Cited

U.S. PATENT DOCUMENTS

| | | | | |
|---|---|---|---|---|
| 5,513,318 A | * | 4/1996 | van de Goor et al. | 714/48 |
| 5,657,443 A | * | 8/1997 | Krech, Jr. | 714/42 |
| 5,761,110 A | | 6/1998 | Irrinki et al. | 365/100 |
| 5,784,328 A | | 7/1998 | Irrinki et al. | 365/222 |
| 5,808,932 A | | 9/1998 | Irrinki et al. | 365/150 |
| 5,822,228 A | | 10/1998 | Irrinki et al. | 364/580 |
| 5,822,516 A | * | 10/1998 | Krech, Jr. | 714/42 |
| 5,847,990 A | | 12/1998 | Irrinki et al. | 365/154 |
| 5,867,423 A | | 2/1999 | Kapoor et al. | 365/168 |
| 6,108,802 A | * | 8/2000 | Kim et al. | 714/718 |
| 6,286,116 B1 | * | 9/2001 | Bhavsar | 714/720 |

OTHER PUBLICATIONS

"Fault Models and Tests specific for FIFO Functionality" by van de Goor et al. published in Records of the 1993 IEEE International Workshop on Memory Testing.*
"Functional Tests for arbitration SRAM–type FIFOs" by van de Goor et al. published in the Proceedings of the First Asian Test Symposium 1992.*

*Design and Algorithms For Parallel Testing Of Random Access And Content Addressable Memories*, P. Mazumder et al., 24th ACM/IEEE Design Automation Conference © 1987, Paper 36.2, pp. 688–694.
*Built–In Self–Test For Multi–Port RAMs*, Yuejian Wu et al., 6 pages.
*A 5Gb/s 9–Port Application Specific SRAM With Built–In Self Test*, Steven W. Wood et al., pp. 68–73.
*Dual Port Static RAM Testing*, Manuel J. Raposa, 1988 International Test Conference, © 1988 IEEE, Paper 20.3, pp. 362–368.
*Associative Processors And Memories: A Survey*, Karl E. Grosspletsch, IEEE Micro, Jun. 1992, IEEE Publication No. 0272–1732/92/0600–0012, pp. 12–19.
*Using March Tests To Test SRAMs*, Ad J. Van De Goor, IEEE Design & Test Of Computers, IEEE Publication No. 0740–7475/93/0300–0008, pp. 8–14.
*Modem/Radio IC Architectures For ISM Band Wireless Applications*, Yanpen Guo et al., IEEE Transactions On Consumer Electronics, vol. 39, No. 2, May 1993, IEEE Publication No. 0098 3063/93, pp. 100–106.
*A High Speed Embedded Cache Design With Non–Intrusive BIST*, Steve Kornachuk et al., 0–8186–62345–X/94, pp. 40–45.

(List continued on next page.)

Primary Examiner—Albert Decady
Assistant Examiner—Cynthia H. Britt
(74) Attorney, Agent, or Firm—Conley Rose & Tayon

(57) ABSTRACT

An efficient and reliable technique is disclosed for detecting faults which occur in FIFO's, including control faults which are specific to FIFO's, as well as faults common to conventional memories, such as interport faults and faults that occur in single port memories. The technique utilizes a sequence of read, write and control operations, thereby avoiding the need to directly observe internal values within the FIFO, such as the full and empty flag values and the shift register values.

33 Claims, 13 Drawing Sheets

OTHER PUBLICATIONS

*On Fault Modeling And Testing Of Content–Addressable Memories*, W. K. Al–Assadi et al., IEEE Publication No. 0–8186–6245–X/94, pp. 78–83.

*Fault Models And Tests For Ring Address Type FIFO*, Ad J. van de Goor et al., IEEE Publication No. 0–8186–5440–6/94, pp. 300–305.

*Testing Complex Couplings In Multiport Memories* M. Nicolaidis et al., IEEE Transactions On Very Large Scale Integration (VLSI) Systems, vol. 3, No. 1, Mar. 1995, IEEE Publication No. 1063–8210/95, pp. 59–71.

*An Efficient Test Method For Embedded Multi–port RAM with BIST Circuitry*, T. Matsumura, IEEE Publication No. 0–8186–7102–5/95, pp. 62–67.

*Yield And Cost Estimation For A CAM–Based Parallel Processor*, W. B. Noghani et al., IEEE Publication No. 0–8186–7102–5/95, pp. 110–116.

*Functional Test For Shifting–Type FIFOs*, Ad J. van de Goor et al., IEEE Publication No. 1066–1409/95, pp. 133–138.

*March LR: A Test For Realistic Linked Faults*, A. J. van de Goor et al., 14$^{th}$ VLSI Test Symposium—1996, IEEE Publication No. 0–8186–7304–4/96, pp. 272–280.

*March U: A Test For Unlinked Memory Faults*, A. J. van de Goor et al., © IEE, 1997, IEE Proceedings online No. 19971147, 6 pages.

*Disturb Neighborhood Pattern Sensitive Fault*, A. J. van de Goor et al., IEEE Publication No. 0–8186–7810–0/97, pp. 37–45.

*An Analysis Of (Linked) Address Decoder Faults*, A. J. van de Goor et al., IEEE Publication No. 0–8186–8099–7/97, pp. 13–20.

*An Open Notation For Memory Tests*, Aad Offerman et al., IEEE Publication No. 0–8186–8099–7/97, pp. 71–78.

*False Write Through And Un–Restored Write Electrical Level Fault Models For SRAMs*, R. Dean Adams et al., IEEE Publication No. 0–8186–8099–7/97, pp. 27–32.

*Use Of Selective Precharge For Low–Power On the Match Lines Of Content–Addressable Memories*, Charles A. Zukowski et al., IEEE Publication No. 0–8186–8099–7/97, pp. 64–68.

*An Approach To Modeling And Testing Memories And Its Application To CAMs*, Piotr R. Sidorowicz et al., IEEE Publication No. 0–8186–8436–4/98, pp. 411–416.

*Fault Models And Tests For Two–Port Memories*, A. J. van de Goor et al., IEEE Publication No. 0–8186–8436–4/98, pp. 401–410.

* cited by examiner

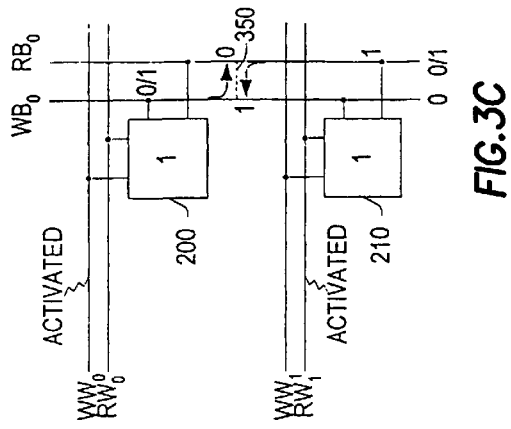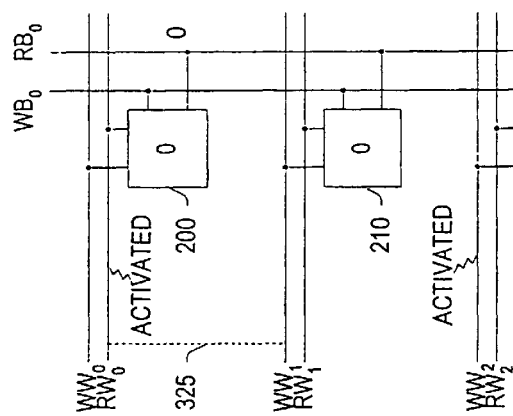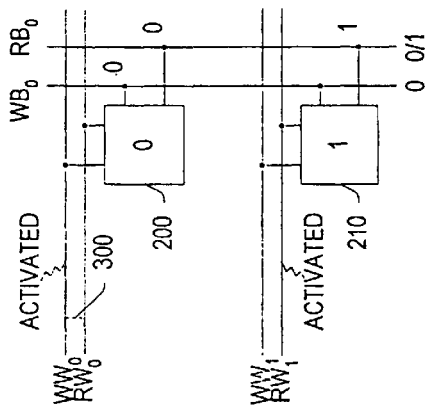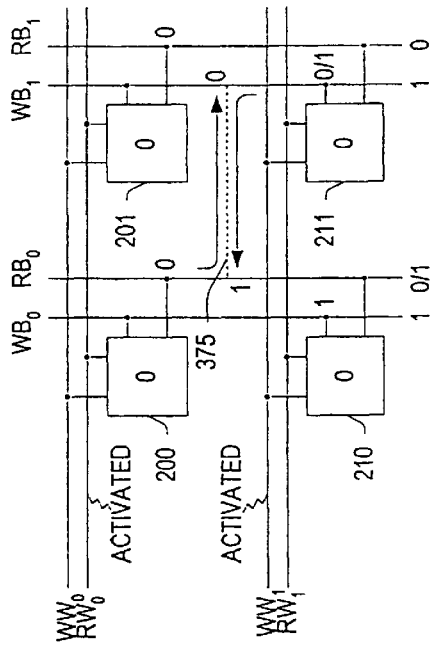

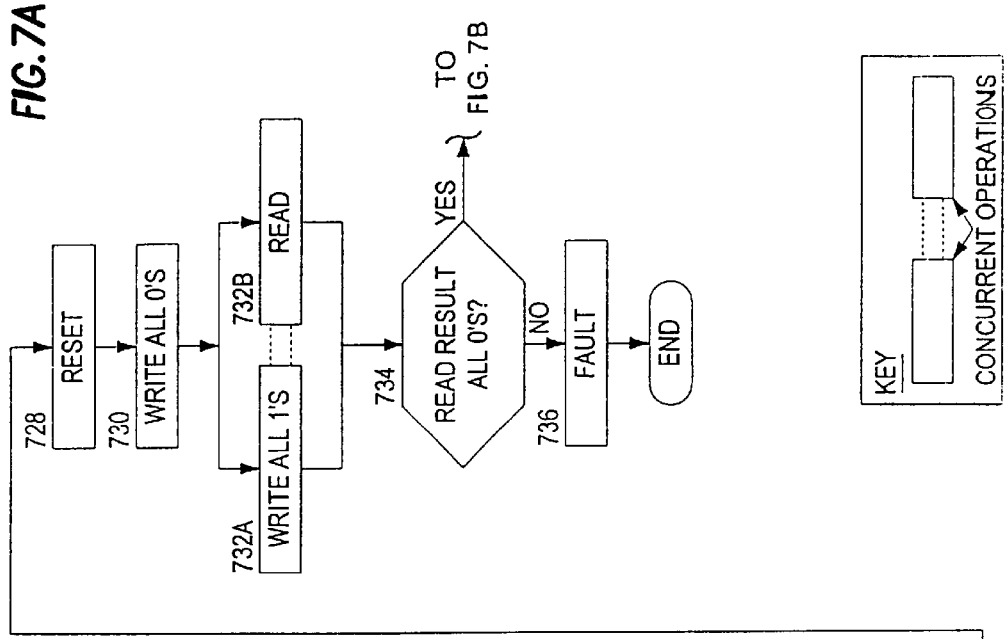
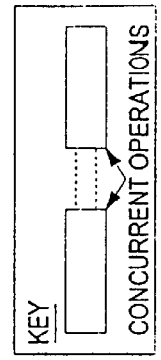
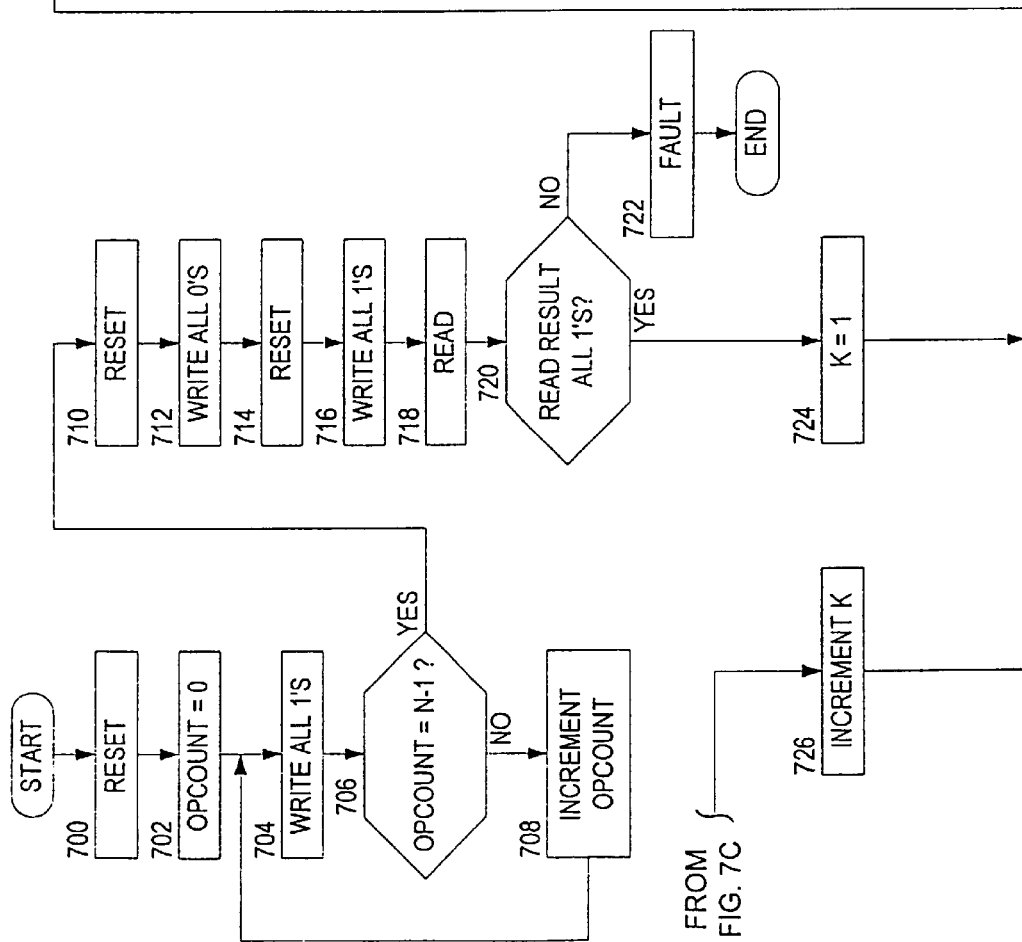
FIG. 7A

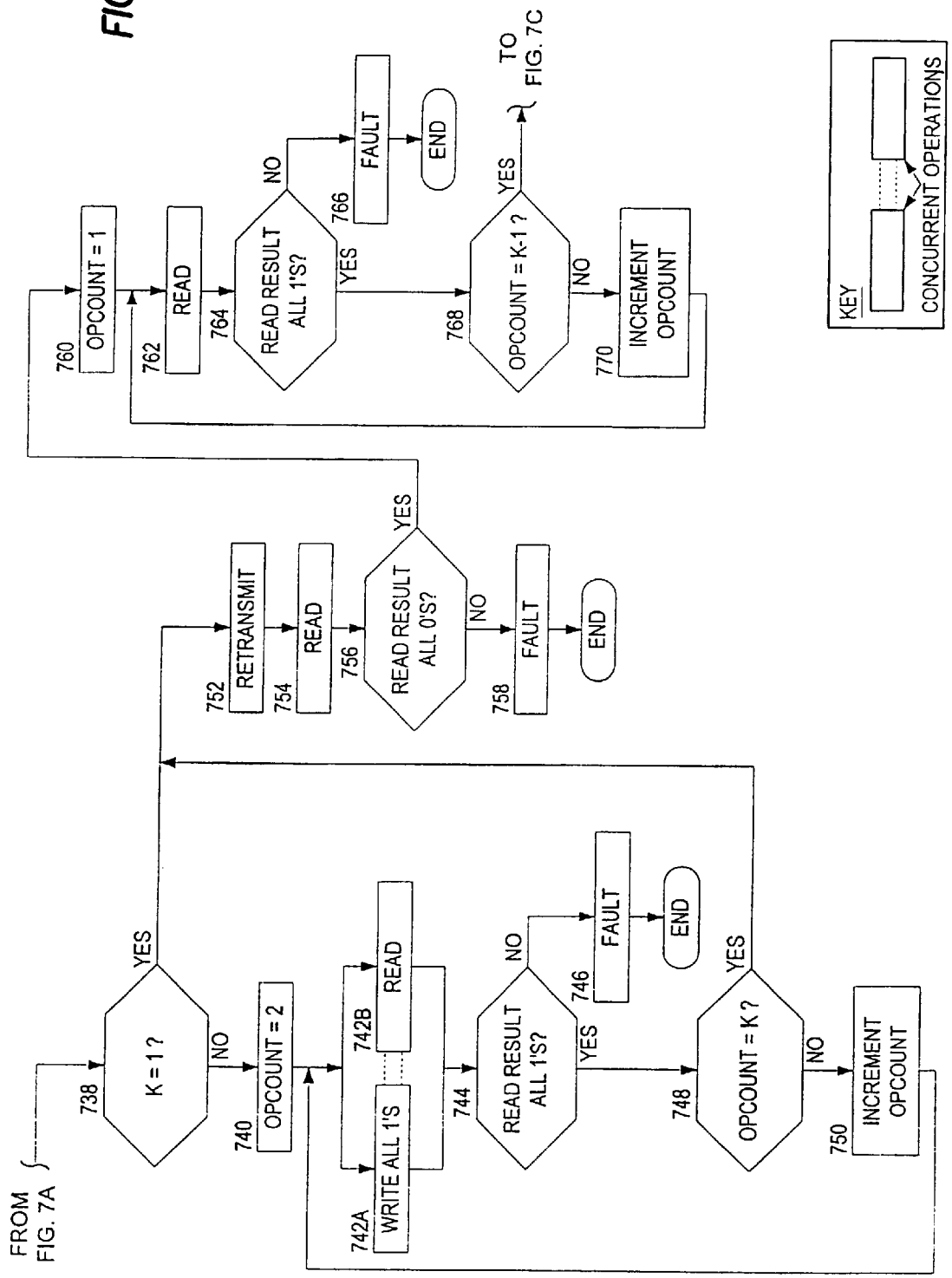

DETECTING FAULTS IN DUAL PORT FIFO MEMORIES

CROSS-REFERENCE TO RELATED APPLICATIONS

This application is related to U.S. patent Ser. No. 09/363697, entitled "Detecting Interport Faults in Static Memories" and filed on Jul. 28, 1999 by Jun Zhao, Mukesh Puri, and V. Swamy Irrinki, the disclosure of which is incorporated herein by reference. This application is also related to U.S. patent Ser. No. 09/372275 entitled "Testing Content Addressable Static Memories" and filed on Aug. 11, 1999 by Jun Zhao, Mukesh Puri, and V. Swamy Irrinki, the disclosure of which is incorporated herein by reference.

FIELD OF THE INVENTION

The present invention relates generally to memory devices and particularly to dual port first-in-first-out (FIFO) memory devices. More particularly, the present invention relates to detecting faults in dual port FIFO memory devices.

BACKGROUND OF THE INVENTION

FIFO Memories

Fast, efficient testing is an important step in manufacturing memory chips, and the price paid for recent advances in semiconductor technology has been a lengthier and more complicated testing process. Consequently, procedures that test the memory thoroughly, quickly, and without complication are highly prized. One type of memory chip is the first-in-first-out (FIFO) memory, commonly referred to simply as a "FIFO." Like conventional memories, a FIFO performs read operations, which retrieve data from the FIFO, as well as write operations, which store data in the FIFO. Unlike conventional memories which permit read and write operations in any desired order at specified memory locations, the FIFO reads out data in the same order the data was written. Suppose, for example, that a first data value is written to the FIFO, followed by a second data value and then a third data value. The first read operation performed on the FIFO will return the first data value. If a second read operation is performed, then the FIFO will retrieve the second data value, and if a third read operation is performed, the FIFO will retrieve the third data value. After the third and final data value is read from the FIFO, no more read operations can occur until another value is written to the FIFO, and thus the FIFO is said to be "empty." The FIFO also may become full if all of the memory locations are written without reading any data. When full, the FIFO prohibits write operations, so data must first be read out of the FIFO to make room for further write operations.

Multiport Architecture

A common feature of current memories, including many FIFO's, is the presence of multiple "ports," or gateways that allow data to be read from and/or written to the memory. The ports on a multiport memory are designed to function independently, allowing memory accesses to multiple locations at the same time. Prior memories, which had a single memory port, could only read or write data in one memory location at a time. Multiple ports thus increase memory throughput, or the speed at which data can be transferred to and from memory. FIFO's often include two ports: one port that writes data, and one port that reads data. Accordingly, data values can be read and written concurrently.

FIG. 1 illustrates a representative multiport memory device 150, comprising an array of memory cells 100, 101, 109, 110, 111, 119, 190, 191 and 199. As shown in FIG. 1, the cells are organized into R rows and C columns, where R and C can be any values. Cells 100 and 101 represent the first two columns of the first row, and cell 109 represents the last (or C–$1^{th}$) column of the first row. Similarly, cells 110, 111, and 119 represent the first, second, and last columns of the second row. In the final (or R–$1^{th}$) row, cells 190, 191, and 199 occupy the first, second, and last columns, respectively. Each memory cell is capable of storing an electric charge, and the charges can be manipulated to store and recall data through the use of special control circuitry (not shown) in the memory 150. Each memory cell can represent one of two values, depending on whether or not the cell holds a charge. The values 1 and 0 are often used to represent the charged and uncharged states, respectively, although the reverse may be true. Because the cells can hold either of two possible values, the memory device 150 is called a "binary" device, and the cell data values are known as binary digits, or "bits."

To fetch and store the data values, the memory device 150 includes signals known as "word lines" and "bit lines" that couple to the cells. The word lines connect cells in the same row and are used to activate the cells along one row at a time. The bit lines connect cells in the same column and are used to carry data to and from the activated cells. In a multiport device, each port has its own word lines and bit lines. The memory device 150 in FIG. 1 is shown with P ports, where P can be any number but is typically less than or equal to 11 under current technology.

The first port includes a first word line $W_{10}$ that connects the cells 100, 101, and 109 in the first row; a second word line $W_{11}$ that connects the cells 110, 111, and 119 in the second row; and additional word lines for the other rows, including a word line $W_{P(R-1)}$ that connects the cells 190, 191, and 199 in the final row. The first port also comprises a first bit line $B_{10}$ that connects the cells 100, 110, and 190 in the first column; a second bit line $B_{11}$ that connects the cells 101, 111, and 191 in the second column; and additional bit lines for the remaining columns, including a bit line $B_{P(C-1)}$ that connects the cells 109, 119, and 199 in the final column. To read data from the first row of cells through the first port, for example, the word line $W_{10}$ is activated. In response to activating the word line $W_{10}$, cells 100 and 101 place their data values onto bit lines $B_{10}$ and $B_{11}$, respectively. Similarly, the other cells in the first row drive their bit lines on the first port with the stored data, including cell 109, which drives bit line $B_{1(C-1)}$ with the data value stored in cell 109.

The word lines and bit lines also can be used to store data in the cells. To write data to the cells in the second row through the first port, for example, the word line $W_{11}$ is asserted to activate the cells in the second row, including cells 110, 111, and 119. At the same time, the values being stored are placed on the bit lines belonging to the first port, including bit lines $B_{10}$, $B_{11}$, and $B_{1(C-1)}$. In response, the cells on the second row store the data encoded by the bit lines. Cell 110 thus stores the value of bit line $B_{10}$, cell 111 stores the value of bit line $B_{11}$, and cell 119 stores the value of bit line $B_{1(C-1)}$.

Similarly, the remaining ports include word lines and bit lines for accessing the memory cells. Ideally, one port can access any row of cells while another port is accessing another row of cells without interference between the two ports, since the ports do not share word lines and bit lines.

FIFO Architecture

FIG. 2 illustrates a representative dual port FIFO memory 250 comprising an array of memory cells 230 which are interfaced via a write bus, a read bus, a write enable line, and a read enable line. The FIFO 250 comprises two ports: a read-only port and a write-only port. Accordingly, the FIFO 250 can execute a read and a write operation in parallel. The memory cells 230 are arranged in words of four bits each, although each word may comprise any number of bits. Memory cells 200–203 represent the lowest address in the array, followed by the memory word formed by cells 210–213 and then the memory word formed by cells 220–223. Memory cells 280–283 form the next to last memory word, while memory cells 290–293 form the final memory word. Letting N represent the total number of memory words in the array 230, cells 200–203 represent the $0^{th}$ word (or "address 0"), and cells 290–293 represent the N–$1^{th}$ word (or "address N–1"). The FIFO 250 also includes a full flag 252 which is set to logic 1 if the FIFO 250 becomes full, and an empty flag 256 which is set to logic 1 if the FIFO 250 is empty. To perform a read operation, the read enable line must be asserted. If a read operation is initiated, or attempted, when the read enable line is deasserted, then the FIFO will not perform the read operation. Similarly, if a write operation is initiated when the write enable line is not asserted, the FIFO will not perform the write operation. The write enable line must be asserted in order to write values to the FIFO 250.

Each word in the FIFO 250 receives a write word line, which activates the word during write operations, and a read word line, which activates the word during read operations. As shown in FIG. 2, Memory word 0 (cells 200–203) couples to write word line $WW_0$ and to read word line $RW_0$, memory word 1 (cells 210–213) receives write word line $WW_1$ and read word line $RW_1$, memory word 2 (cells 220–223) receives write word line $WW_2$ and read word line $RW_2$, memory word N–2 (cells 280–283) receives write word line $WW_8$ and read word line $RW_8$, and memory word N–1 receives write word line $WW_9$ and read word line $RW_9$. Similarly, each column of cells couples to a common bit line on each port. The cells forming the $0^{th}$ column of the array 230 (including cells 200, 210, 220, 280, and 290) couple to write bit line $WB_0$ and to read bit line $RB_0$, and the cells that form the $1^{st}$ column (e.g., cells 201, 211, 221, 281, and 291) couple to write bit line $WB_1$ and to read bit line $RB_1$. Likewise, the cells forming the $2^{nd}$ column (e.g., cells 202, 212, 222, 282, and 292) couple to write bit line $WB_2$ and to read bit line $RB_2$, while the cells that form the $3^{rd}$ column (e.g., cells 203, 213, 223, 283, and 293) couple to write bit line $WB_3$ and read bit line $RB_3$. Accordingly, write bit lines $WB_0$–$WB_3$ form a write bus, and read bit lines $RB_0$–$RB_3$ form a read bus.

A write shift register 232A selects one memory word to be activated on the write port, subject to the values of the write enable line and the full flag 252. The write shift register 232A comprises a series of cascaded register bits 240A–249A, each bit corresponding to one word of the array 230. Register bit 240A, when asserted, selects the $0^{th}$ memory word, for example, while register bits 241A and 242A, when asserted, select the $1^{st}$ and $2^{nd}$ memory words, respectively. Similarly, register bits 248A and 249A correspond to memory words N–2 and N–1, respectively. So that only one word at a time may be selected for write operation, exactly one of the register bits is assigned logic 1 at any given moment. The remaining register bits are cleared to logic 0. The logic 1 value is known as the "write pointer," since it indicates which cell will receive the next write operation. To begin FIFO operation, for example, the write pointer is located in the $0^{th}$ register bit 240A by setting bit 240A to logic 1. The remaining register bits 241A–249A are cleared to logic 0's. Following each write operation, the write pointer is transferred to the next register bit, and the register that held the pointer during the write operation is cleared. Note that the final register bit 249A feeds the initial register bit 240A, so that the write pointer scrolls over to the initial register bit 240A after a write operation occurs at the N–$1^{th}$ memory word.

The full flag 252 and write enable line are combined in an AND gate 254, which activates if the write enable line is asserted and the full flag 252 is deasserted. Each register bit drives a corresponding AND gate which also receives the output signal from AND gate 254. As shown in FIG. 2, AND gates 260A, 261A, and 262A drive write word lines $WW_0$, $WW_1$, and $WW_2$, respectively, while AND gates 268A and 269A drive write word lines $WW_8$ and $WW_9$. Further, register bits 240A, 241A, and 242A drive AND gates 260A, 261A, and 262A, while register bits 248A and 249A drive AND gates 268A and 269A. Accordingly, a given write word line can only become asserted if the write enable line is asserted, if the full flag 252 is deasserted, and if the corresponding register bit is asserted.

A read shift register 232B selects one memory word to be activated on the read port, subject to the values of the read enable line and the empty flag 256. The read shift register 232B comprises substantially the same architecture as the write shift register 232A, including cascaded bits 240B–249B, with bit 249B feeding bit 240B. Each bit corresponds to one memory word. Bits 240B, 241B, and 242B correspond to memory words 0, 1, and 2, for example, while bits 248B and 249B correspond to memory words N–2 and N–1, respectively. Exactly one of the register bits holds a logic 1-valued "read pointer" that indicates which word will be activated for the next read operation. Following each read operation, the read pointer is transferred to the next bit in the register, and the register that held the read pointer during the read operation is cleared to logic 0.

Because the FIFO 250 includes shift registers that carry the read and write pointers, the FIFO of FIG. 2 is commonly known as a pointer-based FIFO. Another type of FIFO, known as a counter-based FIFO, incorporates read and write counters which store the addresses of the read and write locations, respectively. Each counter feeds a decoder, which activates the appropriate word line based on the value of the counter. The read counter increments the read address after each read operation, and the write counter increments the write address after each write operation, thus advancing the read and/or write locations. The counter-based FIFO and pointer-based FIFO thus perform the same function, albeit with slightly different logic structures.

The empty flag 256 and read enable line feed an AND gate 258, which asserts its output line high if the read enable line is asserted and the empty flag 256 is deasserted. Each register bit drives a corresponding AND gate which also receives the output signal from AND gate 258. As shown in FIG. 2, AND gates 260B, 261B, and 262B drive read word lines $RW_0$, $RW_1$, and $RW_2$, respectively, while AND gates 268B and 269B drive read word lines $RW_8$ and $RW_9$. Further, register bits 240B, 241B, and 242B drive AND gates 260B, 261B, and 262B, while register bits 248B and 249B drive AND gates 268B and 269B. Accordingly, a given read word line is asserted only if the read enable line is asserted, if the empty flag 256 is deasserted, and if the pointer is in the corresponding register bit.

In addition to reading and writing data, some FIFO's are capable of manipulating the read and write pointers through reset and retransmit commands. The retransmit command resets the fit read pointer to address 0 of the FIFO, corresponding to register 240B in FIG. 2. Setting the read pointer back to address 0 permits reading the memory words between address 0 and the location of the write pointer. The retransmit command may be used, for example, if the data from a series of read operations becomes garbled in route to its destination. By setting back the read pointer, the retransmit command permits rereading the data. Another command, the reset command, resets both the read pointer and the write pointer to address 0. Thus, the write pointer moves to register bit 240A in response to the reset command, and the read pointer moves to register bit 240B. Note that in some FIFO's, the retransmit command may move the read pointer to the location of the write pointer, although this feature varies among different types of FIFO's.

Although multiport memories are designed to perform multiple operations concurrently through different ports, manufacturing defects can cause one port to interfere with another port, affecting the data values that are read or written through either port. Other manufacturing defects can cause individual cells to interact unreliably. Memory defects are generally classified as cell faults, control faults, read/write logic faults, and interport faults.

Cell Faults

Cell faults generally includes defects known as unlinked faults, coupling faults, linked faults, neighborhood pattern sensitive faults, and complex coupling faults. Unlinked faults represent faults that occur in specific cells, without regard to a particular port or to the values of nearby cells. Types of unlinked faults include stuck-at faults, in which a cell holds a particular data value permanently; transition faults, in which a cell cannot make a transition between two values; and data retention faults, in which a cell fails to retain the correct logic value after a period of time. Table I summarizes unlinked faults.

TABLE I

Unlinked cell faults

| Name | Description |
|---|---|
| Stuck-At Fault | Cell holds either a 0 or a 1 permanently. |
| Transition Fault | Cell cannot transition from 1 to 0, or cell cannot transition from 0 to 1. |
| Data Retention Fault | Cell loses data after a period of time. |

Coupling faults represent faults in which writing a value to one cell influences the data value of another cell. Coupling faults include inversion faults, in which inverting the value of a first cell inverts the value of a second cell; idempotent faults, in which inverting the value of a first cell causes a particular value (either a 1 or a 0) to be stored in a second cell; bridging faults, in which two cells are shorted together; state faults, in which a first cell is forced to a certain value if and only if a second cell holds a particular value; and disturbance faults, in which a first cell changes value in response to a read or write operation in a second cell. Bridging faults can behave as one of two types: AND-type or OR-type. In an AND-type fault, a first cell is forced to 0 if and only if a 0 is stored in second cell. In an OR-type fault, a first cell is forced to 1 if and only if a 1 is stored in a second cell. Table II summarizes coupling faults.

TABLE II

Coupling cell faults

| Name | Description |
|---|---|
| Inversion Fault | Inverting the value of one cell causes an inversion in another cell. |
| Idempotent Fault | Inverting the value of one cell causes another cell to hold a specific value (either a 1 or a 0). |
| Bridging Fault | Storing a 0 in a cell causes another cell to hold a 0, but storing a 1 in the cell does not affect the other cell (AND-type). Storing a 1 in a cell causes another cell to hold a 1, but storing a 0 in the cell does not affect the other cell (OR-type). |
| State Fault | A first cell is forced to either 1 or 0 if and only if a second cell holds a particular value. |
| Disturbance Fault | Reading or writing one cell inverts the value of another cell. |

Other cell faults include linked faults, neighborhood pattern sensitive faults, and complex coupling faults. Linked faults comprise multiple coupling faults which occur when three or more cells interact to form faults. A first cell, for example, may affect the value of a second cell, which affects the value of a third cell. In another linked fault scenario, the first and third cells both affect the value of the second cell. The other previously discussed cell faults, by contrast, each occur between a single pair of cells. Neighborhood pattern sensitive faults typically appear as stuck-at, transition, or two-cell coupling faults, but only occur when nearby cells are in a particular state. Complex coupling are weak coupling faults that tend to occur only when multiple ports access the memory simultaneously. Table III summarizes these other cell faults.

TABLE III

Other cell faults

| Name | Description |
|---|---|
| Linked Fault | Involves two or more basic cell faults. |
| Neighborhood Pattern Sensitive Faults | A stuck-at, transition, or coupling fault that occurs when a neighboring cell is in a particular state. |
| Complex Coupling Fault | Weak coupling fault that tends to occur only when multiple ports simultaneously access a memory cell. |

Interport Faults

Due to manufacturing defects such as short circuits and capacitive coupling between the ports, interport faults may occur when two or more ports access memory in parallel. Interport faults may be generally classified as word line shorts at the same row, word line shorts between adjacent rows, bit line shorts at the same column, and bit line shorts between adjacent columns. Word line shorts at the same row occur when activating a word line belonging to a first port causes the word line of a second port on the same row of memory cells to activate. Referring again to FIG. 1, if word line $W_{10}$ (port 1, row 0) is shorted (or connected) to word line $W_{20}$ (port 2, row 0), then activating word line $W_{10}$ will activate word line $W_{20}$ (and vice versa) if the short behaves as an OR-type short (as if the word lines were logically OR-ed), resulting in a word line short at the same row. If the short behaves as an AND-type short, however, then word line $W_{10}$ can be activated only if word line $W_{20}$ is activated at the same time, and vice versa (as if the word lines were logically AND-ed). Word line shorts between adjacent rows happen when a word line on one port affects the word line of a different port on an adjacent row. If word line $W_{20}$ (port 2, row 0) is shorted to word line $W_{11}$ (port 1, row 1), for example, then activating word line $W_{11}$ causes word line $W_{20}$ to activate if the short behaves as an OR-type short, resulting in a word line short between rows. Similarly, an AND-type short between word lines $W_{11}$ and $W_{20}$ will prevent either word line from being activated unless the other word line is also activated at the same time.

Bit line shorts at the same column occur when two bit lines on different ports, but in the same column, are connected. For example, a bit line short occurs if bit line $B_{11}$ (port 1, column 1) connects to bit line $B_{21}$ (port 2, column 1). The result of a short between bit line $B_{11}$ and $B_{21}$ is that when $B_{21}$ is asserted, $B_{11}$ is asserted (and vice versa). Bit line shorts between columns occur when the bit line of one port is shorted to the bit line of another port in an adjacent column. If asserting bit line $B_{11}$ (port 1, column 1) asserts bit line $B_{20}$ (port 2, column 0), then the resulting defect is known as a bit line short between columns. Table IV summarizes the basic types of interport faults.

TABLE IV

Interport faults.

| Name | Description |
| --- | --- |
| Word line fault at same row | Word lines of different ports are shorted at the same row. |
| Word line fault between rows | Word lines of different ports are shorted at adjacent rows. |
| Bit line fault at same column | Bit lines of different ports are shorted at the same column. |
| Bit line fault between column | Bit lines of different ports are shorted at adjacent columns. |

FIG. 3A illustrates a word line fault in the FIFO of FIG. 2, using cells 200 and 210 as an example, at the first row of the memory array. As in FIG. 2, the write port comprises word line $WW_0$ driving cell 200, word line $WW_1$ driving cell 210, and bit line $WB_0$ serving as the input signal for cells 200 and 210. Similarly, the read port comprises word line $RW_0$ driving cell 200, word line $RW_1$ driving cell 210, and bit line $RB_0$ serving as the output signal for cells 200 and 210. Further, memory cell 200 holds a logic 0 value, and memory cell 210 holds a logic 1. As shown, a short 300 exists between word lines $WW_0$ and $RW_0$. If the short behaves as an OR-type short, then word line $RW_0$ becomes activated when word line $WW_0$ is activated, and word line $WW_0$ becomes activated if word line $RW_0$ becomes activated. In the example of FIG. 3A, a write operation is executed at cell 200, concurrently with a read operation of cell 210. Thus, the write port activates word line $WW_0$ to access cell 200, and the read port activates word line $RW_1$ to read the value of cell 210. Prior to the write operation, write bit line $WB_0$ is driven to a logic 0 value. Cell 210 responds to the activation of word line $RW_1$ by placing a logic 1 onto bit line $RB_0$. If the short 300 behaves as an AND-type short, then the write word line $WW_0$ will fail to pull high, however, and cell 200 will not receive the logic 0 value. If the fault behaves as an OR-type short, then both word lines $WW_0$ and $RW_0$ will pull high, and cell 200 will drive bit line $RB_0$ with a logic 0, resulting in a bit line conflict with the logic 1 from cell 210. Depending on the nature of the memory technology, the read bit line $RB_0$ may go to either the logic 0 or the logic 1.

FIG. 3B illustrates a word line fault between cells 200 and 210. FIG. 3B also depicts cell 220, at the third row of the array. As shown, memory cells 200, 210, and 220 each hold logic 0 values. A short 325 exists between word lines $RW_0$ and $WW_1$. If the short 325 behaves as an OR-type short, and if either word line $RW_0$ or word line $WW_1$ is activated, then the other word line becomes activated. If the short 325 behaves as an AND-type short, however, then neither word line $RW_0$ nor $WW_1$ can activate unless the other activates. In the example of FIG. 3B, a read operation is performed at cell 200 by activating word line $RW_0$, and a concurrent write operation cell is performed at 220 by activating word line $WW_2$. Prior to the write operation, bit line $WB_0$ is driven with a logic 1 value. In response to activating word line $WW_2$, cell 220 accepts the logic 1 value from bit line $WW_0$. Because of short 325, word line $RW_0$ will only activate if the short behave as an OR-type short. Accordingly, if short 325 behave as an AND-type short, the read operation will fail. If short 325 behaves as an OR-type short, then activating word line $RW_0$ will cause word line $WW_1$ to become activated. Accordingly, cell 210 will improperly receive the logic 1 value from bit line $WW_0$.

Note that the short 325 occurs between the read word line of one cell and the write word line of the cell one address higher. Shorts which occur between a read word line and the write word line one address higher are known as type T1 word line shorts. In some cases, another type of short may occur between the read word line of a cell and the write word line of the cell one address lower. Shorts which occur between a read word line and a write word line in which the write word line is one address lower are known as type T2 word line shorts.

FIG. 3C illustrates a bit line fault at the same column, using cells 200 and 210 in the first column of the memory array. As shown, cells 200 and 210 hold logic 1 values. A write operation is performed at cell 200 by driving bit line $WB_0$ to logic 0 and activating word line $WW_0$. At the same time, a read operation is performed on cell 210 by activating word line $RW_1$. Cell 200 thus receives the logic 0 value from bit line $WB_0$, and cell 210 drives bit line $RB_0$ with a logic 1 value. A short 350 exists between bit lines $WB_0$ and $RB_0$, however, resulting in either a read failure or a write failure. If the short 350 behaves as an OR-type short, then both bit lines $RB_0$ and $WB_0$ will carry a logic 1 value, and the write operation will fail. If the short 350 behaves as an AND-type short, then both bit lines $RB_0$ and $WB_0$ will carry a logic 0 value, and the read operation will return a logic 0 instead of a logic 1.

FIG. 3D illustrates a bit line fault between column 0 of the memory array, which comprises cells 200 and 210, and column 1 of the array, which includes cells 201 and 211. All four cells hold logic 0 values. In the example, a read operation is performed at row 0 of the array by activating word line $RW_0$, causing cells 200 and 201 to drive bit lines $RB_0$ and $RB_1$, respectively, with logic 0 values. Similarly, a write operation is performed at row 1 of the array by activating word line $WW_1$, causing cells 210 and 211 to accept values from bit lines $WB_0$ and $WB_1$, respectively. As shown, a short 375 exists between bit lines $RB_0$ and $WB_1$. Because bit line $WB_1$ is driven with a logic 1 value for the write operation and cell 200 is driving bit line $RB_0$ with a logic 0 value for the read operation, the short 375 will cause a data conflict. If the short 375 behaves as an OR-type short, then bit lines $RB_0$ and $WB_1$ will both carry logic 1 values, and the read operation will fail. If the short 375 behaves as an AND-type short, then bit lines $RB_0$ and $WB_1$ will both carry logic 0 values, and the write operation will fail.

In the examples of FIGS. 3A and 3C–D, the shorts 300, 350, and 375 resulted in conflicting values on the bit lines because some bit lines were driven with conflicting values. Note that if a read and write operation drive the same bit line with the same value (i.e., if a write operation and a read operation both place logic 0 onto a bit line), then a fault may not be apparent. For example, the short 300 between word lines $WW_0$ and $RW_0$ in FIG. 3A will not affect the values on bit lines $WB_0$ and $RB_0$ if cell 210 holds a logic 0 value or if the write operation at cell 200 stores a logic 1. A short that results in a bit line conflict will cause the bit line to carry either a 0 or 1 value, however, depending on whether the short behaves as an AND-type short or an OR-type short.

Control Faults

In addition to the faults listed above, FIFO's are susceptible to faults known as control faults. Control faults generally include faults on the read and write enable lines, faults at the full flag and empty flag, and failure to execute the reset and retransmit commands. Faults in pointer-based FIFO's also occur in the shift registers. Read/write faults can occur when the FIFO permits read and/or write operations, even when the associated read and write enable lines are deasserted. Other read/write faults occur when the FIFO is permanently disabled from reading and/or writing, regardless of the read and write enable line values.

Shift register faults can occur when the write shift register 232A and/or the read shift register 232B fail to properly manipulate the pointers. In some types of faults, a register bit is stuck at logic 0 or fails to store a logic 1. When pointer reaches the register bit, the pointer essentially vanishes, preventing the activation of any memory word on that port. Other types of faults cause a register bit to become stuck at 1 or fail to store a logic 0. Consequently, a logic 1 value is passed to the next register bit during each operation on that port, activating multiple memory words on that port. In some instances, the shift register may fail to shift altogether, keeping the pointer at the same memory word indefinitely.

Faults also may occur in the full flag and empty flag. One type of fault occurs if the full flag fails to set when the FIFO becomes full. Another type of fault occurs if the full flag is set when the FIFO is not full. Similarly, faults occur at the empty flag if the empty flag is set when the FIFO is not empty or if the empty flag fails to set when the FIFO becomes empty, such as after a reset command.

Certain other faults prevent proper execution of the reset and retransmit commands. A reset fault occurs when either the write pointer or read pointer (or both) fail to reset to address 0 in response to a reset command. A reset fault may also occur if a previous pointer bit fails to clear to logic 0. Similarly, a retransmit fault occurs when the read pointer fails to reset to address 0 in response to a retransmit command, or when address 0 sets to logic 1 but the previous pointer location fails to clear to logic 0.

Testing Faults in FIFO Memories

Memory faults are unacceptable, so memory devices are thoroughly tested during the manufacturing process and discarded if any faults are detected. In the last few years, various techniques have been proposed for modeling and testing memory devices. Some of these techniques deal with random access memories, however, and do not apply to FIFO memory chips. Single port memories usually are tested using a technique called the March C algorithm, for example, or a variant of March C such as the March C−, March C+, Smarch, or March LR algorithm.

The March C Algorithm includes six "passes," each of which addresses each memory cell individually. During Pass 1, March C writes a test pattern into the cells. The test pattern may be any desired sequence of bits, such as a "checkerboard" pattern, but often comprises all 0's. The 0 values can be written in any order, although the cells usually are addressed consecutively from address 0 to address N−1 or from address N−1 to address 0, where N represents the number of bits in the memory. Note also that N may represent the number of memory words, if desired, and the test may operate by addressing entire words instead of individual bits. Passes 2–5 also address each cell consecutively, executing two operations in sequence at each address. Passes 2 and 3 address the memory from address 0 to address N−1. During the first operation at each address in Pass 2, the test reads the current address to verify the value that was written during Pass 1. If the read operation does not return value that was written during Pass 1, then a fault is detected. The fault may have occurred either during the write operation of Pass 1 or the read operation of Pass 2 (or both). Next, the test inverts (or "complements") the data value of the current address. Thus, if the current cell holds a 0 value, then the test writes a 1 value to the cell, and vice versa. Similarly, the first operation of Pass 3 performs a read operation to verify the value written in Pass 2, and the second operation writes the inverted value to the cell. If the read operation returns a value different that the one written in Pass 2, then a fault is detected.

Passes 4–5 address the memory from cell N−1 to cell 0. The first operation in Pass 4 reads the current cell to verify the value that was written during Pass 3, and the second operation inverts the value through a write operation. Similarly, each iteration of Pass 5 first reads the value of the current cell to verify the value that was written during Pass 4 and then writes a complemented value to the cell. If the wrong value is read during any iteration of Pass 4 or Pass 5, then a fault is detected. Such a fault may have occurred during the read operation itself or during the previous write operation (or both). During Pass 6, the test reads each cell to verify the value that was written during Pass 5. As in Pass 1, the cells may be addressed in any order but preferably are accessed from address 0 to address N−1 or from address N−1 to address 0. If the wrong value is detected in any cell during Pass 6, a fault is detected. Table V summarizes the operations of the March C Algorithm in which the initial test pattern is zero for each cell.

TABLE V

March C Algorithm.

| Pass | Start Address | End Address | Operation 1 | Operation 2 |
|---|---|---|---|---|
| 1 | 0 or N−1 | N−1 or 0 | Write 0 to Address | None |
| 2 | 0 | N−1 | Read 0 from Address | Write 1 to Address |

TABLE V-continued

March C Algorithm.

| Pass | Start Address | End Address | Operation 1 | Operation 2 |
|---|---|---|---|---|
| 3 | 0 | N-1 | Read 1 from Address | Write 0 to Address |
| 4 | N-1 | 0 | Read 0 from Address | Write 1 to Address |
| 5 | N-1 | 0 | Read 1 from Address | Write 0 to Address |
| 6 | 0 or N-1 | N-1 or 0 | Read 0 from Address | None |

Unfortunately, the March C algorithm cannot detect interport faults which occur in multiport memories, including FIFO's. Though alternative techniques have been developed to detect interport faults, most of these techniques fail to detect all of the possible interport faults. Other techniques require modifications to the memory device. Such modifications, however, may be prohibitively expensive to mass produce or may prove incompatible with the needs of the is end user. Still other techniques require a large number of tests, and thus extensive testing time, unless detailed structural information about the memory is known. Although some techniques have been developed to effectively test interport faults, many of these tests cover only interport faults, failing to detect other types of faults. Other techniques which cover interport faults make the assumption that all ports are read/write ports, so faults that occur between read-only ports and between write-only ports are not detected. In addition, some of these tests require random access addressing, which cannot be executed on a FIFO. Further, these tests fail to detect FIFO-specific faults, such as faults in the full and empty flags, faults in the shift registers, and reset/retransmit faults.

Control faults in FIFO's can be particularly difficult to track, since many signals involved in implementing the control operations cannot be directly observed. The values of the full and empty flags, for example, typically cannot be read from the memory. Although the read and write enable lines are input to the memory and can therefore be observed, it is difficult to determine whether asserting and deasserting the enable lines successfully activate memory locations. Similarly, FIFO's do not permit the values of the read and write shift registers to be read out, and without directly observing the shift register values it is difficult to verify operation of the reset and retransmit commands.

For the foregoing reasons, an efficient and reliable technique for detecting memory faults in FIFO memories, including dual port FIFO's, would greatly improve the manufacturing and testing of memories. Such a technique, if devised, should cover all possible faults which occur in FIFO's, including control faults which are specific to FIFO's, as well as faults common to conventional memories, such as interport faults and faults that occur in single port memories, without requiring excessive testing time. Further, the technique should apply to any type of memory design without requiring modifications to the cell architecture and should cover both read and write ports. In addition, without actually having to observe internal values in the FIFO, the test should uncover control faults which normally would require observing the values. Despite the apparent advantages that such a technique would provide, no device or method provides these features.

SUMMARY OF THE INVENTION

Accordingly, the present invention discloses an efficient and reliable technique for detecting faults which occur in FIFO's, including control faults which are specific to FIFO's, as well as faults common to conventional memories, such as interport faults and faults that occur in single port memories. Further, the faults are detected without directly observing internal values within the FIFO, such as the full and empty flag values and the shift register values.

In accordance with a preferred embodiment, an Interport FIFO Test that detects interport faults in a FIFO comprises 14 test stages, including 5 write passes and 4 read passes. In order to expose interport faults, the interport test executes read and write operations in which the read operations and write operations occur at different addresses. Because FIFO's do not accept read and write addresses, the address offset is accomplished by executing the read and write operations in a particular order.

A first portion of the test comprises executing a plurality of write operations until the write pointer reaches a first predetermined position relative to the read pointer. Next, the test performs a plurality of concurrent read and write operations. In a preferred embodiment, the first predetermined position is calculated to place the write pointer 2 addresses behind the read pointer (or N-2 addresses ahead of the read pointer) during the concurrent operations. The concurrent operations are executed in multiple passes through the memory, and the test write values are inverted before each new pass so that the test detects interport faults and cell faults. By executing concurrent operations, interport faults are activated and detected by the read operations. A second portion of the test comprises performing a plurality of write operations until the write pointer reaches a second predetermined position relative to the read pointer, and the test then performs concurrent read and write operations, maintaining the read and write pointer at a fixed number of addresses apart. The second portion of the test also preferably includes multiple passes, with the write test data inverted for each pass to activate cell faults. In a preferred embodiment, the second predetermined position is calculated to place the write pointer 1 address behind the read pointer (or N-1 addresses ahead of the read pointer) during the concurrent operations. Note that the test may comprise only the first portion or only the second portion if the memory layout is known. If the memory layout is not known, then the test preferably includes both portions.

In another preferred test embodiment, a flag test that detects faults in the full and empty flags comprises 8 test stages. In order to expose faults in the full and empty flags, the flag test attempts to execute write operations when the full flag is set and to execute read operations when the empty flag is set. If the FIFO executes an attempted operation, then a fault is detected. To positively identify that the FIFO has executed an attempted operation, the test writes two different test values into two different memory locations. The flag test reads a single memory location determine whether or not the FIFO executed a read or write operation.

The full and empty flag test comprises first resetting the read and write pointers and then writing test values to the memory until the memory is full, a condition which should trigger the full flag. The last value written to the memory equals the complement of the value written to the first memory location. Next, another write operation is attempted at the first memory location, using the complement of the value previously written to the first memory location, and then a read operation is performed. If the full flag fails to prevent the attempted write operation, then the read operation will return the complemented test value. Thus, a fault is declared unless the read operation returns the test value. Next, a series of read operations is performed through the last memory location. Thus, the empty flag should set, preventing further read operations. Nevertheless, an additional read operation is attempted. If the FIFO executes the attempted read operation, the read value will be the test value written to the first memory location. If the FIFO does not execute the attempted read operation, then the FIFO will either tristate its read lines or return the value written to the last memory location, which equals the complement of the value written to the first memory location. Thus, the flag test is implemented using only a single memory by manipulating the test values used for the write operations.

In another preferred embodiment, an enable line test detects faults in the read and write enable lines by attempting read operations with the read enable line deasserted, attempting write operations with the write enable line deasserted, and then determining whether the FIFO executed the attempted operations. The enable line test first initiates two write operations, the first operation with the write enable asserted, and the second operation with the write enable line deasserted. The second write operation writes the complement of the value used for the first write operation. A first read operation, which preferably is executed concurrently with the second write operation, verifies the value written during the first write operation. A second read operation then is attempted. If deasserting the write enable line successfully prevented the second write operation, then the empty flag will be set after the first read, thus preventing the second read. Thus, if the second read operation returns the test value from the second write attempt, a fault is detected in the write enable line. Next, a third write operation is performed with the write enable line asserted, with the same test write value used for the second write operation, and the read pointer is relocated through a retransmit command. After relocating the read pointer, a third and a fourth read operation are performed. The third read operation is attempted with the read enable deasserted, and the fourth read operation is executed with the read enable asserted. If the FIFO does not execute the first read operation, then the second read operation will return the value of the first write operation. If the FIFO does execute the first read operation, however, then the second read operation will return the value of the second write operation, which is the complement of the first write operation. Thus, the enable line test detects faults in the enable lines by verifying that read and write operations cannot occur with the read and write enable lines deasserted.

A preferred embodiment of a reset and retransmit test activates and detects faults in the reset and retransmit operations. Because the reset and retransmit operations may occur when the pointers are at any locations within the memory, the reset and retransmit test tests each memory address individually. First, the reset and retransmit test initializes the array and verifies that the write pointer will reset from address 1. To test the write pointer at address 1, the test performs a first write operation at address 0, followed by a reset command, a second write operation, and then a read operation. The first write operation complements the data written to the array during initialization. The second write operation complements the data at address 0 written during the first write operation. If the read operation returns the test value written during the first write operation, then the reset operation must have failed. The reset command is verified only if the read operation returns the test value written during the second operation.

Next, the reset and retransmit executes a procedure to test the reset and retransmit commands for the remaining addresses. A preferred embodiment discloses a test procedure that is executed repeatedly to test the remaining addresses 1 to N−1. When testing the $K^{th}$ address, the reset and retransmit test first resets the read and write pointers to address 0. Next, the test writes a series of test values to memory addresses 0 through K and performs a series of read operations on memory addresses 0 to K. In a preferred embodiment, the read operations at addresses 0 through K−1 occur concurrently with the write operations at addresses 1 through K, in order to expedite the test. Also, the test value written to the first address represents the complement of the test value written to address K. Following the read and write operations, the read pointer is located at address K, and the write pointer is located at address K+1. A retransmit command then is executed to relocate the read pointer to address 0, and another series of read operations is performed to verify the values in addresses 0 to K−1. If the read pointer fails to relocate, the read operations will detect the fault.

Next, the read and write pointers are reset to address 0, and the test executes two write operations at addresses 0 and 1, followed by two read operations to verify the write operations at addresses 0 and 1. In a preferred embodiment, the read operation at address 0 occurs concurrently with the write operation at address 1. The write operation at address 0 stores the same test value used to initialize the memory at the beginning of the test, but the write operation at address 1 stores the complement of the initialization value. Because the two read operations return complementary values, faults in the reset command can be detected. Accordingly, the reset and retransmit test verifies the operation of the reset and retransmit operations at any given address, using only read, write, reset, and retransmit operations and thus avoiding the need to observe internal values within the FIFO.

A memory tester capable of implementing the FIFO fault test comprises control circuitry capable of accessing a FIFO and managing the test operations. Accordingly, a control logic device manages the test operations by driving control lines to the FIFO (including write enable, reset, retransmit, write enable, and any other control line), by transmitting write data to the FIFO, and by receiving and evaluating read data from the FIFO. The memory test includes a write register that receives write values from the control logic and places the write value onto a write bus attached to the FIFO. Accordingly, the FIFO accepts the value of the write register during write operations. Similarly, the memory test includes a read register that receives read values from the FIFO. The control logic is thus capable of determining the read value by examining the read register. In addition, the memory tester includes a comparator capable of comparing the read register value with a predetermined expected value. The expected value represents the value expected to be returned from a read operation. Thus, the control logic supplies the expected value to the comparator, which asserts a match signal if the expected value matches the contents of the read register. Accordingly, the control logic is capable of performing read and write operations to the FIFO and determining whether read operations return the values expected, as described in the memory tests.

Thus, the present invention comprises a combination of features and advantages that enable it to substantially advance the art by providing a method and apparatus for testing faults in FIFO memories. These and various other characteristics and advantages of the present invention will be readily apparent to those skilled in the art upon reading the following detailed description of the preferred embodiments of the invention and by referring to the accompanying drawings.

DETAILED DESCRIPTION OF THE PREFERRED EMBODIMENTS

Interport FIFO Test

Table VI, below, summarizes the preferred embodiment of an Interport FIFO Test that detects interport faults in a FIFO, or faults between the read and write port. The Interport FIFO Test comprises a plurality of concurrent operations which each include a read operation and a write operation executed in parallel. Thus, at least part of the read operation occurs during at least part of the write operation. If an interport fault exists between the read and write port, then executing the read and write operations concurrently will cause failures in the test, thereby exposing the fault. A preferred embodiment envisions accessing the memory in words, and thus the variable N in Table VI preferably represents the number of memory words in the FIFO. If desired, however, the FIFO data may be accessed in bytes, nibbles, or any number of bits, including one bit. Thus, the variable N should be interpreted in accordance with the chosen data size.

TABLE VI

Interport FIFO Test.

| Stage | Write Address Range | Write Value | Read Address Range | Read Value |
|---|---|---|---|---|
| 1 | 0 to N-3 | All 0's | None | None |
| 2 | N-2 to N-1 | All 0's | Write Address + 2 − N | All 0's |
| 3 | 0 to N-3 | All 1's | Write Address + 2 | All 0's |
| 4 | N-2 to N-1 | All 1's | Write Address + 2 − N | All 1's |
| 5 | 0 to N-3 | All 0's | Write Address + 2 | All 1's |
| 6 | N-2 to N-1 | All 0's | None | None |
| 7 | | Reset | | |
| 8 | 0 | All 1's | None | None |
| 9 | 1 to N-2 | All 1's | Write Address − 1 | All 1's |
| 10 | N-1 | All 0's | Write Address − 1 | All 1's |
| 11 | 0 | All 0's | Write Address − 1 + N | All 0's |
| 12 | 1 to N-2 | All 0's | Write Address − 1 | All 0's |
| 13 | N-1 | All 1's | Write Address − 1 | All 0's |
| 14 | 0 | All 1's | Write Address − 1 + N | All 1's |

BRIEF DESCRIPTION OF THE DRAWINGS

A better understanding of the present invention can be obtained when the following detailed description of preferred embodiments is considered in conjunction with the following to drawings, in which:

FIGS. 3A–D illustrate interport faults;

FIGS. 7A–C illustrate flowcharts of a first execution of a reset and retransmit test in accordance with a preferred embodiment.

Figure 1:
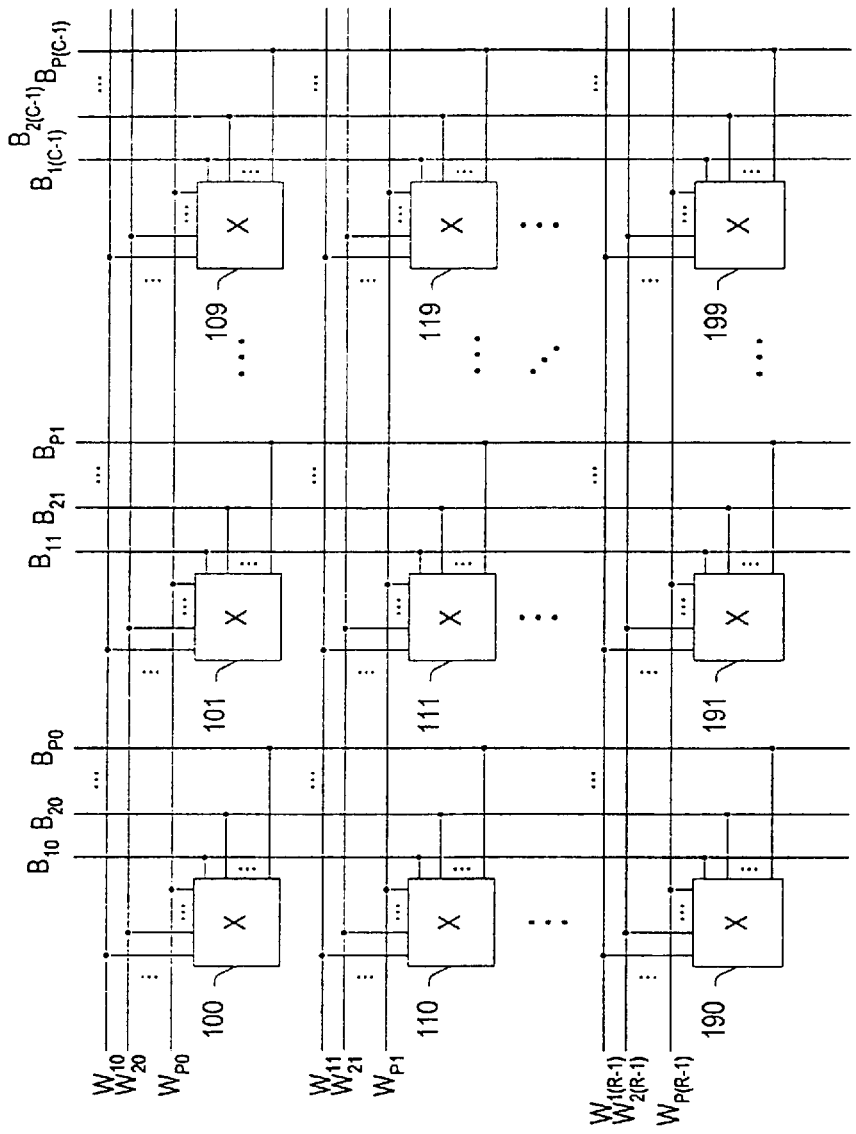
FIG. 1 illustrates a prior art static random access memory array.
Figure 2:
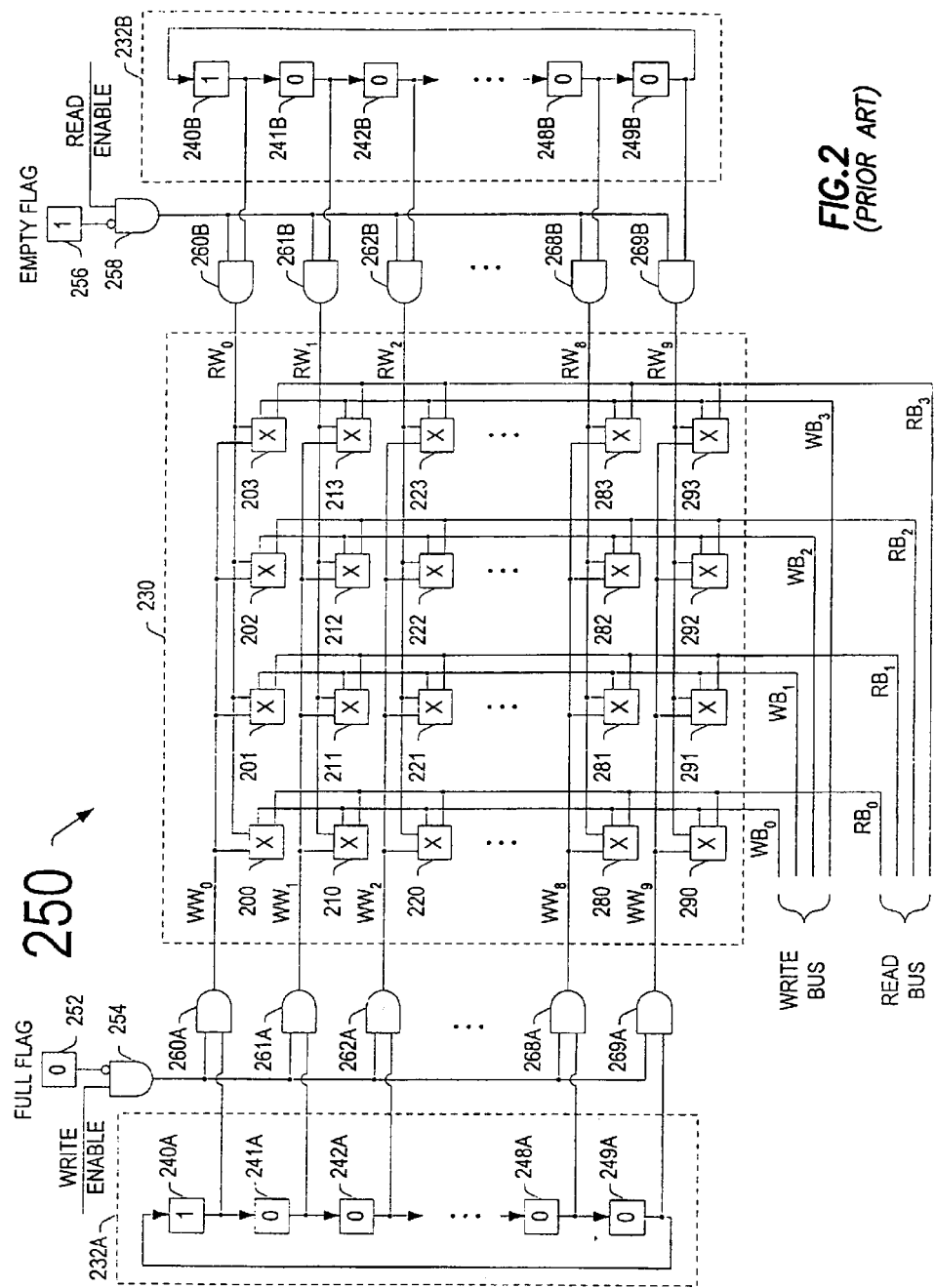
FIG. 2 illustrates a dual port FIFO memory.

Stage 1 comprises writing a series of test values to initialize all but the final two words of the FIFO. Thus, Stage 1 executes N−2 write operations, from address 0 to address N−3. A preferred embodiment envisions that each of the test values comprises all 0's. Note that the test values may be any desired values, however, including different test values for each test word. Moreover, each test word may contain any desired combination of 0's and 1's without departing from the spirit of this disclosure.

Stage 2 comprises a series of two write operations which write test values to addresses N−2 and N−1, the final two memory locations. As in Stage 1, the test values preferably comprise all 0's. Concurrently with each write operation, Stage 2 executes a read operation to verify test values written during earlier operations. Specifically, the first read operation, which occurs in parallel with the write operation at address N−2, occurs N−2 addresses below the write address, which is address 0, or equivalently at two addresses above the write address (modulo N). Likewise, the second read operation, which occurs in parallel with the write operation at address N−1, occurs N−2 addresses below the write address, which is address 1. The values returned from the read operation should correspond to the values written to those addresses during Stage 1. Accordingly, in a preferred embodiment the read operations should return all 0's. If either read operation fails to return all 0's, then an interport fault or a memory fault has occurred.

Stage 3 comprises a series of N−2 concurrent read and write operations. The write operations preferably invert the memory contents by writing the complements of the test values written during Stages 1–2. Accordingly, in a preferred embodiment and as summarized in Table VI, the test values in Stage 3 comprise all 1's. Because the last write operation in Stage 2 occurs at memory address N−1, the first write operation in Stage 3 occurs at memory address 0, and the final Stage 3 write occurs at address N−3. Similarly, because the last read operation in Stage 2 occurs at memory address 1, the Stage 3 read operations occur from address 2 to address N−1, or two addresses higher than the write operations. If the memory is fault-free, then the read operations should return the test values written to those addresses during Stages 2 and 3. Accordingly, if any read operation fails to return all 0's, then an interport fault or a memory fault has occurred.

Stage 4 comprises two write operations at addresses N−2 and N−1, along with concurrent read operations at addresses 0 and 1. The write operations store the complements of the values stored at addresses N−2 and N−1 during Stage 2. Because the test values in Stage 2 comprise all 0's, the test write values in Stage 4 preferably comprise all 1's. The concurrent read operations verify that addresses 0 and 1 contain the data values written to those addresses during the write operations of Stage 1. Because the test stored all 1's at addresses 0 and 1 during Stage 1, an interport fault or a memory fault is detected if the read operations of Stage 4 fail to return all 1's.

Stage 5 writes test values to all memory words except the final two addresses. The test values in Stage 5 preferably represent the complements of the test values written to the cells during Stage 3. Thus, each write operation during Stage 5 stores all 0's. The test also executes a concurrent read operation with each write operation in Stage 5. As in Stage 3, the read operations occur a number of addresses (preferably two addresses) above the write operations. Thus, the write operations occur from address 0 to address N−3, and the read operations occur from address 2 to address N−1. The read operations verify the test values which were written during Stages 3 and 4, which were all 1's. Accordingly, if any of the read operations of Stage 5 fails to return all 1's, then an interport fault or a memory fault has occurred.

Stage 6 comprises a pair of write operations to initialize the final to memory addresses, N−2 and N−1, to all 0's. Next, a reset command is issued to the memory in Stage 7 to reset the read and write pointers.

Stage 8 comprises a single write operation at address 0, with no concurrent read operation. The test value written during Stage 8 represents the complement of the test value last written to address 0 during Stage 6. Thus, in a preferred embodiment, the test value for Stage 8 comprises all 1's.

Stage 9 comprises a series of write operations from address 1 to address N−1. The test values for the write operations are the complements of the test values last written to those addresses. Because the last values written to those addresses in Stages 5 and 6 were all 0's, Stage 9 preferably writes all 1's to the memory at each address. Concurrently with each write operation, the test executes a read operation at the cell one address below the write operation. The read operation verifies the test value written to the cell during the previous iteration. Accordingly, if a read operation fails to return all 1's, then an interport fault or an interport fault or a memory fault has occurred.

Stage 10 comprises one write operation, at address N−1, and a concurrent read operation, at address N−2. The write operation stores the complement of the test value written during Stage 6. Thus, the test write value in Stage 10 preferably comprises all 0's. The concurrent read operation verifies the test word, comprising all 1's, that was written to address N−2 during Stage 9. If the read operation fails to return all 1's, then the test has exposed an interport fault or a memory fault.

Stage 11 comprises a write operation at address 0 and a concurrent read operation at address N−1. The test write value preferably comprises the same test value written during Stage 10, which comprises all 0's in a preferred embodiment. The read operation verifies the test value written to address N−1 during Stage 10. Thus, if the read operation fails to return all 0's, then the test has exposed an interport fault or a memory fault.

Stage 12 comprises a series of write operations from address 1 to address N−2. During each operation, the test executes a concurrent read operation to verify the test value written to the cell one address lower. Thus, the read operations are executed from address 0 to address N−3. Stage 12 preferably uses the same test value used in Stage 11, or all 0's. Thus, if each read operation fails to return all 0's, an interport fault or a memory fault has occurred.

Stage 13 performs a write operation at address N−1 and a concurrent read operation at address N−2. The test write value comprises the complement of the value used during Stage 12, corresponding to all 1's in a preferred embodiment. The read operation verifies the test word of all 0's which was written to address N−2 during Stage 12. Thus, if the read operation fails to return all 0's, then the test has exposed an interport fault or a memory fault.

Stage 14 performs a write operation at address 0 and a concurrent read operation at address N−1. The test write value comprises the same value used during Stage 13, corresponding to all 1's in a preferred embodiment. The read operation verifies the test word of all 1's written to address N−1 during Stage 13. Thus, if the read operation fails to return all 1's, then the test has exposed an interport fault or a memory fault.

Note that although it is preferred that the read operations in Stages 2–5 occur two addresses higher than the concurrent write operations, the read operations may occur any desired number addresses above the write operations in Stages 2–5, without departing from the spirit of this disclosure. The exact address offset may be set initially by increasing or decreasing the number of write operations in Stage 1. Similarly, although it is preferred that the read operations in Stages 9–14 occur one address lower than the write operations, any desired address offset may be used as desired.

Figure 4A:
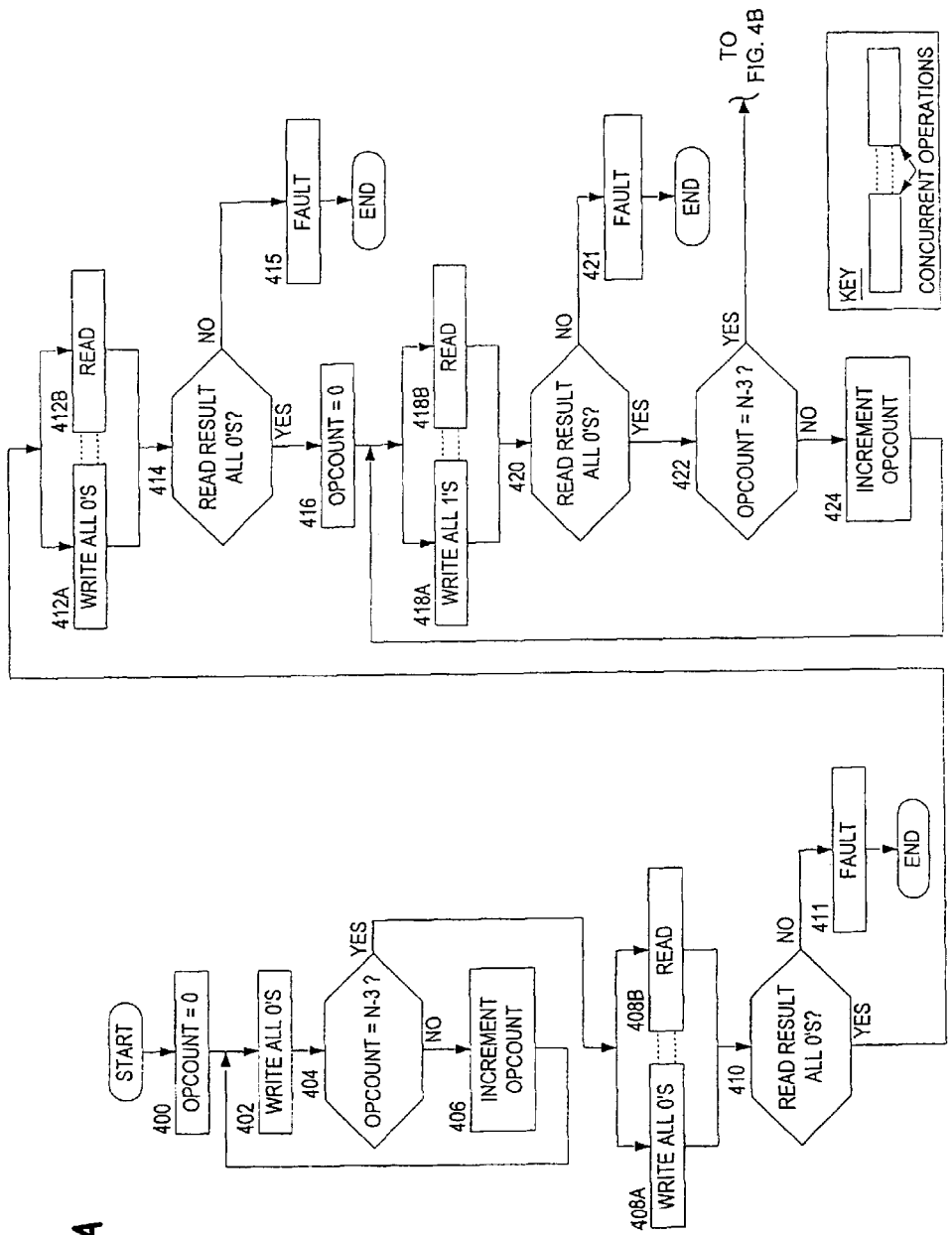
FIGS. 4A–D illustrate flowcharts of an interport FIFO test in accordance with a preferred embodiment.

FIGS. 4A–4D illustrate a flowchart of the FIFO interport test of Table VI. Referring initially to FIG. 4A, blocks 400–406 implement Stage 1 of the interport test. The test preferably begins with the read and write pointers located at address 0. A variable "opcount" is used to count the test iterations. In block 400, opcount is initialized to 0. Next, in block 402, the test writes all 0's to the current address. The test then repeats block 402, incrementing the value of opcount in block 406 after each repetition, until opcount reaches N−3. Because the FIFO automatically increments the write pointer after each operation, each write occurs one address higher than the previous operation. As shown in block 404, the test exits Stage 1 after block 402 if opcount equals N−3. Note that the final write operation also occurs at address N−3, so that the write pointer is set to address N−2 after Stage 1.

Blocks 408–415 represent Stage 2. As shown in concurrent blocks 408A and 408B, the test performs a write operation and a read operation concurrently. The write operation, as shown in block 408A, stores all 0's into the current memory location at address N−2. Accordingly, the FIFO automatically moves the write pointer to N−1 after block 408A. Because block 408B represents the first read operation of the interport test, the read pointer is set to address 0. Thus, the test executes the read operation of block 408B to verify the test value of all 0's written to address 0 during Stage 1. The FIFO then moves the read pointer to address 1. If the read operation in block 408B fails to return all 0's, then a fault has been discovered (block 411), and the test ends. Otherwise, the test proceeds to the concurrent read operations of blocks 412A–B. As shown in block 412A, the concurrent write operation places all 0's into the memory at address N−1, which is the current location of the write pointer. The FIFO then automatically moves the write pointer to address 0. During block 412B, the test performs a read operation at the location of the read pointer, which is located at address 1. The FIFO then increments the read pointer to address 2 after the read operation. If the read operation fails to return the test value of all 0's that was written to address 1 during Stage 1, then a fault has been discovered (block 415), and the test ends. Note that the test need not end after a fault is detected; the test may continue, if desired, in order to count the number of faults which occur throughout all stages of the test.

Stage 3, as shown in blocks 416–424, is executed next if the read operation in block 412B of Stage 2 returns all 0's (block 414). Beginning with block 416, the opcount variable is set to 0. Next, the test executes concurrent write and read operations in blocks 418A–B. Due to the previous read and write operations, the write pointer is located at address 0 prior to Stage 3, and the read pointer is located at address 2. The write operation, as shown in block 418A, writes all 1's to the current write address. The read operation verifies the last value written to the current read address, or all 0's. If the read operation fails to return all 0's (block 420), then a fault is declared (block 421), and the test ends. Otherwise, the Stage 3 increments opcount in block 424 and repeats blocks 418–424 until opcount reaches N−3. When opcount reaches N−3, the test advances to Stage 4, as illustrated in FIG. 4B.

Figure 4B:
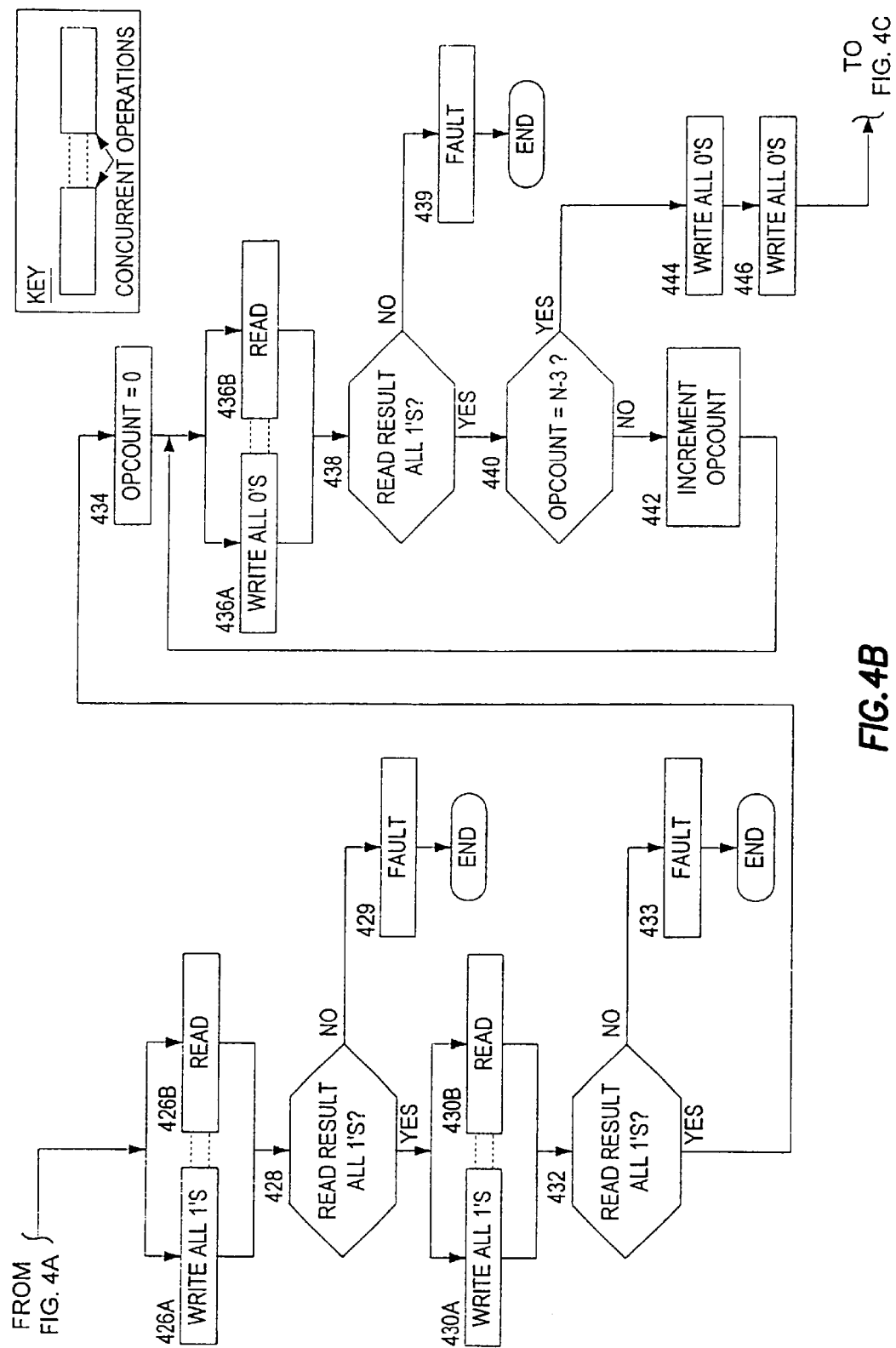

Now referring to FIG. 4B, Stage 4 is illustrated in blocks 426–433. After Stage 3 and prior to Stage 4, the write pointer is set to address N−2, and the read pointer is set to address 0. Beginning with blocks 426A–B, the test performs concurrent write and read operations at addresses N−2 and 0, respectively. The FIFO then increments the write and read pointers. As shown in block 426A, the test write value comprises all 1's. The test read, which occurs in block 426B, verifies the test value of all 1's that was written during Stage 3. If the read result fails to return all 1's (block 428), then a fault is declared (block 429), and the test ends. Otherwise, the test executes another pair of concurrent write and read operations, as shown in blocks 430A–B, at addresses N−1 and 1, which represent the positions of the read and write pointer, respectively, after the operations of blocks 426A–B. Following blocks 430A–B, the write pointer increments to address 0, and the read pointer increments to address 2. The test write value in block 430A comprises all 1's, and the test read operation in block 430B verifies the test value of all 1's that was written to address 1 during Stage 3. If the read result does not comprise all 1's (block 432), then a fault is declared in block 433, and the test ends. If the read result returns all 1's in block 432, then the test progresses to Stage 5, as shown in blocks 434–440.

Prior to Stage 5, the write pointer is located at address 0, and the read pointer is located at address 2. Beginning with block 434, Stage 5 begins by initializing the opcount variable to 0. Next, the test executes concurrent write and read operations in blocks 436A–B. The test write value, as shown in block 436A, comprises all 0's. The read operation in block 436B verifies the test value of all 1's that was written previously. If the read result returns all 1's (block 438), then the test increments the opcount variable (block 442) and repeats the concurrent operations of blocks 436A–B until opcount reaches N−3. If any of the read results fails to return all 1's in block 438, however, then a fault is declared in block 439, and the test ends. If no faults are detected when opcount reaches N−3 in block 440, then Stage 5 ends.

Stage 6 is implemented in write blocks 444 and 446, which follow block 440. Prior to Stage 6, the write pointer is located at address N−2. Thus, the write operations of blocks 444 and 446 occurs at addresses N−2 and N−1. In accordance with Table VI, above, the test write values in blocks 444 and 446 comprise all 0's. Following block 446, the test implements Stage 7, as shown in FIG. 4C.

Figure 4C:
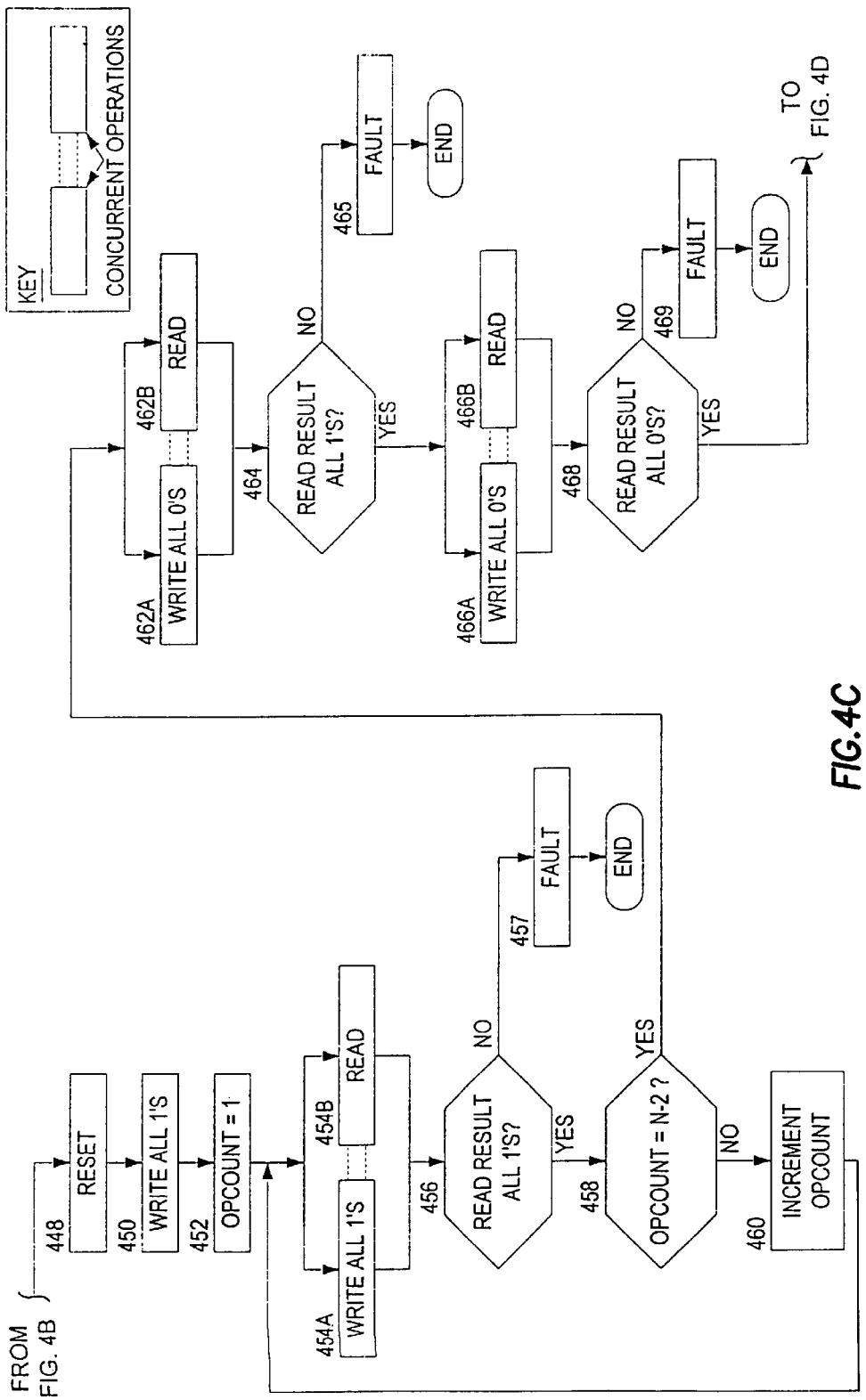

Now referring to FIG. 4C, Stage 7 comprises executing a reset operation that sets both the write pointer and the read pointer to address 0. Following Stage 7, block 450 executes Stage 8, which writes a test value of all 1's to the FIFO. Following the write operation of block 450, the FIFO increments the write pointer to address 1. Next, Stage 9 is executed in blocks 452–460. Beginning with block 452, the opcount variable is initialized to 0. In block 454A, the test writes a test value of all 1's to the FIFO. Concurrently, in block 454B, the test performs a read operation to verify the test value of all 1's written during the previous iteration. If the read result returns all 1's (block 456), and if the opcount variable is less than N−2 (block 458), then the opcount variable increments by 1 (block 460). If the read result does not return all 1's, however, then a fault is declared in block 457, and the test ends. The test repeats blocks 454–460 until either a fault is declared in block 457 or opcount reaches N−2 in block 458. If no fault is detected, then the test proceeds to Stage 10. Following the N−2 read and write operations of Stage 9, the write pointer is located at address N−1, and the read pointer is located at address N−2.

Stage 10 is illustrated in blocks 462–465. Beginning with block 462A, the test writes a test value of all 0's to the FIFO. The write operation of block 462A occurs at address N−1, and the write pointer then rolls over to address 0. Concurrently with the write operation, the test executes a read operation at address N−2 (block 462B) to verify the last write operation of Stage 9. If the read operation fails to return the test word of all 1's written during Stage 9, then the test ends with a fault (block 465). Otherwise, the test executes Stage 11 beginning with blocks 466A–B. Prior to Stage 11, the write pointer is located at address 0, and the read pointer is located at address N−1. As shown in block 466A, Stage 11 writes a test value of all 0's to the memory at address 0. Concurrently, a read operation is performed in block 466B to verify the test value of all 0's written during Stage 10. The read and write pointers thus increment to addresses 0 and 1, respectively. If the read operation fails to return all 0's, then a fault is declared (block 469), and the test ends. If the read operation returns all 0's, then the test proceeds to Stage 12, as illustrated in FIG. 4D.

Figure 4D:
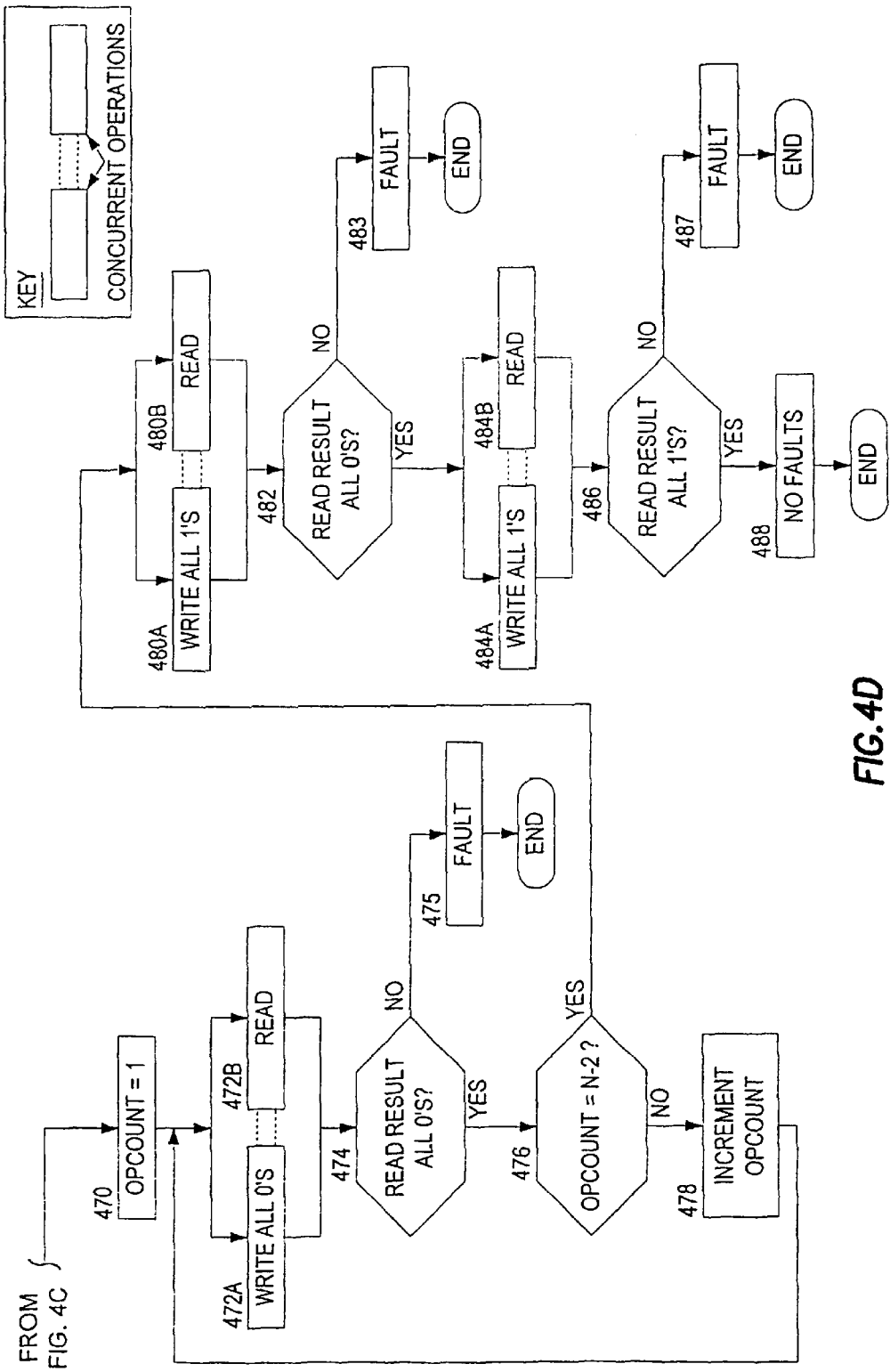

Now referring to FIG. 4D, Stage 12 is shown in blocks 470–478. Prior to Stage 12, the write pointer is located at address 1, and the read pointer is located at address 0. Beginning with block 470, the opcount variable is initialized to 1 to begin a series of N−2 test iterations. Next, in block 472A, the test performs a write operation at the current address, and the FIFO advances the write pointer to the next address. Concurrently, the test performs a read operation at the current address, and FIFO then advances the read pointer. Note that because the position of the read pointer is one address behind the write pointer just prior to Stage 12, each read operation in block 472B occurs one address behind the concurrent write operation in block 472A. As shown in block 472A, the test write value comprises all 0's. Accordingly, the test read operation, if successful, should return all 0's. If the read result does not return all 0's (block 474), then a fault is declared in block 475, and the test ends. Otherwise, if opcount equals N−2, indicating that the final iteration has occurred, then the test proceeds to Stage 13, as shown in blocks 480–483. If opcount is not equal to N−2, however, then opcount is incremented (block 478), and the test repeats beginning with blocks 472A–B.

Just prior to Stage 13, the write pointer is located at address N−1, and the read pointer is located at address N−2. Stage 13 comprises a pair of concurrent read and write operations. As shown in block 480A, the write operation stores a test word of all 1's to memory location N−1. Concurrently, the read operation of block 480B verifies the test word of all 0's written to address N−2 during the final iteration of Stage 12. Thus, if the read result fails to return all 0's (block 482), then a fault is declared in block 483. Otherwise, the test progresses to Stage 14.

As shown in blocks 484A–B, Stage 14 comprises concurrent read and write operations. The write operation (block 484A) writes a test value of all 1's to address 0, and the read operation (block 484B) verifies the test word of all 1's written during Stage 13. If the read result comprises all 1's (block 486), then the interport FIFO test completes successfully, with no faults (block 488). If the read result does not return all 1's, however, then the test ends with a fault (block 487).

Accordingly, the interport FIFO test detects interport faults between adjacent memory locations. In particular, Stages 3–5 activate and detect bit line shorts and word line shorts at the same row. Additionally, Stages 3–5 activate and detect type T1 word line shorts, which are word line shorts between a write word line at one address and a read word line at a lower address. Stages 8–14 also activate and detect bit line shorts and word line shorts at the same row. Moreover, Stages 8–14 activate and detect type T2 word line shorts, which are word line shorts between a read word line at one address and a write word line at a lower address.

Flag Test

Table VII, below, summarizes the preferred embodiment of a Flag Test that detects faults in the full and empty flags of the FIFO.

TABLE VII

Full Flag and Empty Flag Test.

| Stage | Address Range | Operation |
| --- | --- | --- |
| 1 | | Reset |
| 2 | 0 to N−2 | Write All 0's |
| 3 | N−1 | Write All 1's |
| 4 | 0 | Write All 1's |
| 5 | 0 | Read All 0's |
| 6 | 1 to N−2 | Read All 0's |
| 7 | N−1 | Read All 1's |
| 8 | 0 | Read All 0's |

As summarized in Table VII, a preferred embodiment of the Flag Test comprises eight stages. Stage 1 executes a reset operation, which sets the read and write pointers to address 0. Stage 2 comprises a series of write operations from addresses 0 to N−2. The test values written during Stage 2 may comprise any desired value, although all of the write operations should use the same test value. In a preferred embodiment, the test value for Stage 2 comprises all 0's, as shown in Table VII. In Stage 3, the Flag Test executes another write operation to memory location N−1. The test write value in Stage 3 is formed as the complement of the test write value of Stage 2. Thus, under a preferred embodiment, the test in Stage 3 writes a test value of all 1's to memory location N−1. Following Stage 3, the FIFO will scroll the write pointer back to memory address 0. In addition, the FIFO should set the full flag, since N write operations have occurred without any read operations. In Stage 4, however, a write command is sent to the FIFO, with the test value formed as the complement of the test value written to address 0 during Stage 2. Because the full flag is set, however, the FIFO should not permit any write operations. If the FIFO does permit a write operation even though the full flag is set, or if the full flag failed to set during Stage 3, then the write operation of Stage 4 will reverse the bits of memory word 0.

Stage 5 executes a read command to determine the value of memory address 0. If the full flag was set in Stage 3, and if the FIFO successfully blocked the write operation of Stage 4, then the read operation of Stage 5 should return a value of all 0's. If the read operation returns all 1's, then the test has exposed a fault in the full flag.

Stage 6 executes a plurality of read operations, from address 0 to address N−2. Because the write operations of Stage 2 wrote all 0's from address 0 to address N−2, the read operations of Stage 6 should return all 0's. Next, in Stage 7, the test reads the memory at address N−1, the final address in the memory. Following Stage 7, the read pointer overflows to address 0. Assuming that the full flag is operating properly, the write pointer is also located at address 0, since the write operation in Stage 4 failed. Thus, reading address N−1 should set the empty flag. Because the test value preferably comprises all 1's at address N−1, the read bit lines charge to logic 1's during Stage 7.

Stage 8 initiates a read command in the FIFO. If the empty flag is set, however, then the FIFO should prevent the read command from executing. If the read value is prevented, then the FIFO either will drive its read bit lines with the value of the previous read operation at address N−1 (i.e., all 1's) or will drive the read bit lines to a tristate, or high impedance, level. If the read operation occurs, however, then the FIFO will drive the read bit lines to the value of memory location 0, which is the current location of the read pointer. Because the value stored in memory address 0 (all 0's) is the complement of the value stored in memory address N−1 (all 1's), the read bit lines will change if the read operation is successful, thus exposing an empty flag fault.

Figure 5:
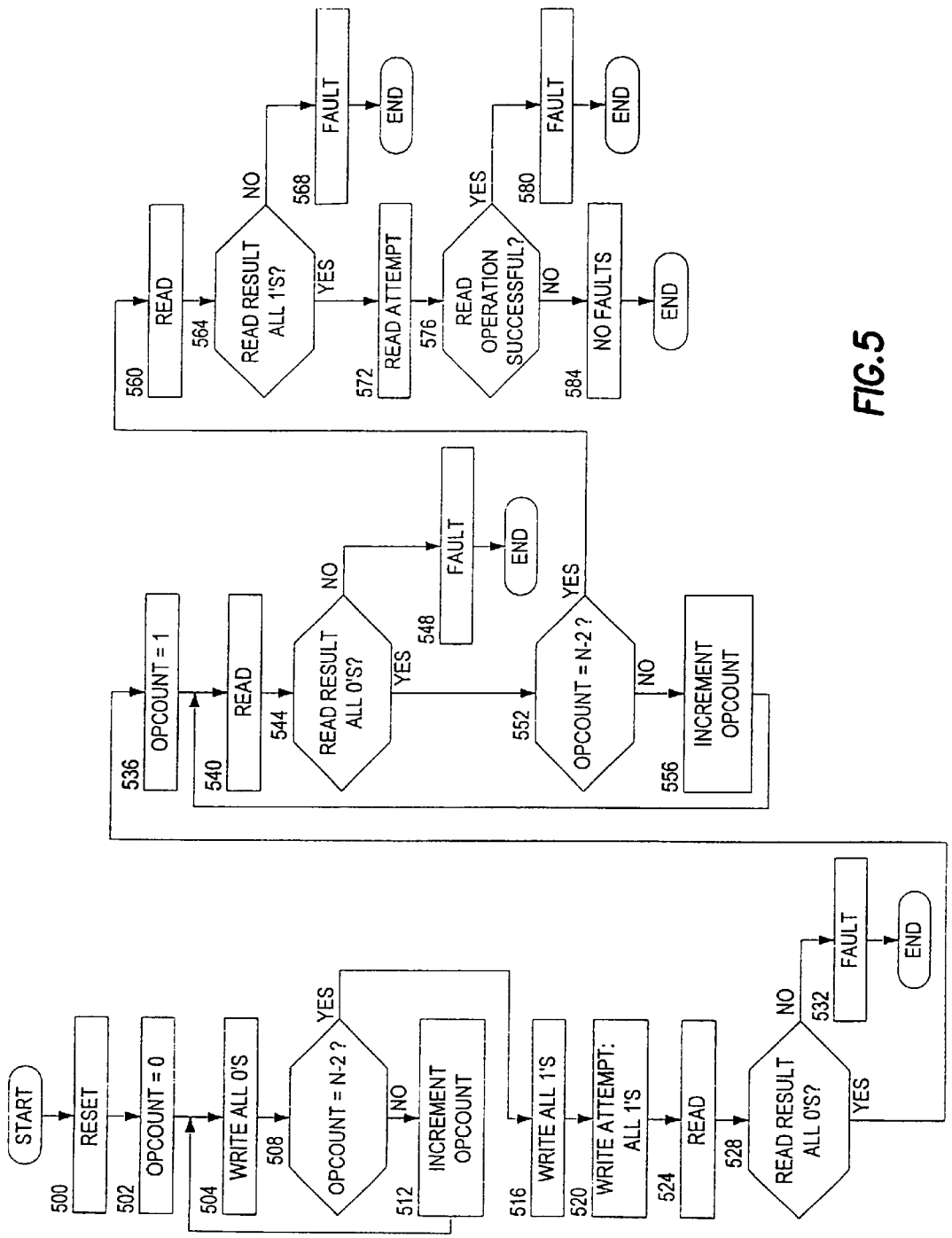
FIG. 5 illustrates the flowchart of a test for faults in the full flag and empty flag in accordance with a preferred embodiment.

FIG. 5 illustrates the flowchart of the Flag Test, according to a preferred embodiment. The test begins with Stage 1 in block 500, which resets the read and write pointers to address 0. Next, blocks 502 through 512 implement Stage 2, which executes a series of write operations using a test word that comprises all 0's. A variable opcount, which is used to track the iterations of Stage 2, is set to 0 in block 502. Next, in block 504, the test performs a write operation to the current memory location, preferably storing the test value during each write operation. Next, unless opcount equals N−2 (block 508), the memory test increments opcount in block 512 and begins another iteration at block 504. When opcount reaches N−2 at block 508, the test advances to Stage 3, shown in block 516.

Blocks 516 and 520 illustrate Stages 3 and 4, respectively. In block 516, the Flag Test writes a test word of all 1's, or the complement of the test word used for addresses 0 through N−2, to memory location N−1. Thus, following block 516, the write pointer is located at address 0. Further, the full flag should set in response to the write operation at block 516. Next, in block 520 the Flag Test attempts another write operation, with the full flag set. The test write word in block 520 comprises the complement of the contents of the address 0, which currently comprises a test value of all 0's. The FIFO, if working properly, will not permit the write operation to occur, however. Accordingly, the full flag should remain set, and the write pointer should remain at address 0. If the write operation does occur, however, then the data value at memory location 0 will become inverted to all 1's, and the write pointer will advance to address 1.

Next, in block 524, Stage 5 of the test executes a read operation at address 0. If the read result fails to return all 0's (block 528), then the test ends with a fault in block 532. In particular, if the write operation of block 520 is successful, then the read operation of block 524 will return all 1's, indicating a fault in the full flag.

If the full flag test is successful, then the Flag Test continues with Stage 6, illustrated in blocks 536–556. As shown in block 536, the variable opcount is initialized to 1. Next, in block 540, a read operation is performed at the current memory address. If the read result returns all 0's in block 544, which represents the value stored during Stage 2, then Stage 6 advances to block 552. Otherwise, the test ends with a fault condition in block 548. In block 552, if opcount equals N−2, then Stage 6 completes, and the test progresses to Stage 7, illustrated in block 560. Otherwise, opcount is incremented in block 556, and Stage 6 returns to block 540 for another iteration.

Stage 7 of the Flag Test begins with block 560, which performs a read operation at the current memory location. Note that after Stage 6, the read pointer is located at address N−1. Thus, the read operation of block 560 should verify the value of all 1's stored at address N−1. Following the read operation, the read pointer should advance to address 0 and the empty flag should set. If the read operation fails to return a value of all 1's, then the test ends with a fault condition at block 568. Otherwise, if the read operation returns a value of all 1's, the test advances to Stage 8, illustrated by blocks 572–584.

In block 572 the test attempts to initiate a read operation in the FIFO. If the empty flag is properly set during Stage 7, however, the FIFO should not permit the read operation to occur. Accordingly, if the read operation occurs (block 576), then the test ends with a fault condition in block 580. Otherwise, if the read operation does not occur, then the test ends with no faults detected (block 584). Note that in some memories, the read bit lines will become tristated, or held at a voltage in between logic 1 and logic 0, if a read operation fails. Accordingly, the test ends with no faults in block 584 if the FIFO tristates the read bit lines in response to the read operation of block 572. In other memories if a read operation fails, the read bit lines are held at the value of the previous read operation. Because the value at address N−1 comprises the complement of the value at address 0, the read bit lines in such a memory will invert only if the read operation is successful. Thus, if the read bit lines remain at a value of all 1's from the previous read operation, or if the read bit lines become tristated, then the read operation did not occur in block 572, and the test ends with a no fault condition in block 584.

Accordingly, the Flag Test detects faults in the full and empty flags. If the full flag fails to set, then Stage 5 will detect the fault. Similarly, if the empty flag fails to set, then Stage 8 will detect the fault. Note that although the full and empty flags are both tested in the same algorithm, the flags may be tested individually by implementing a subset of the Flag Test stages.

Enable Line Test

Table VIII, below, summarizes the preferred embodiment of an Enable Line Test that verifies the operations of the read and write enable lines in the FIFO. In particular, the Enable Line Test (1) ensures that write operations occur if the write enable line is asserted, (2) write operations do not occur if the write enable line is deasserted, (3) read operations occur if the read enable line is asserted, and (4) read operations do not occur if the read enable line is deasserted. Accordingly, the test operations are executed with a variety of enable line states, to ensure that the read and write operations occur when and only when the enable lines are asserted. Note that a logic 1 value is used in Table VIII to indicate "Asserted" for the "Enable Status" column and the "Empty Flag" column, while a logic 0 value indicates "Deasserted."

TABLE VIII

Write Enable and Read Enable Test

| Stage | Operation | Value | Enable Status | Empty Flag | Write Pointer | Read Pointer |
|---|---|---|---|---|---|---|
| 1 | Reset | N/A | N/A | 1 | 0 | 0 |
| 2 | Write | All 1's | Write Enable = 1 | 0 | 1 | 0 |
| 3 | Write | All 0's | Write Enable = 0 | 1 | 1 | 1 |
|   | Read | All 1's | Read Enable = 1 |   |   |   |
| 4 | Read | All 0's | Read Enable = 1 | 1 | 1 | 1 |
| 5 | Write | All 0's | Write Enable = 1 | 0 | 2 | 1 |
| 6 | Re-transmit | N/A | N/A | 0 | 2 | 0 |
| 7 | Read | All 1's | Read Enable = 0 | 0 | 2 | 0 |
| 8 | Read | All 1's | Read Enable = 1 | 0 | 2 | 1 |

During Stage 1 of the Enable Line Test, the FIFO is reset, transferring the read and write pointers to address 0 and setting the empty flag. In Stage 2, a test value is written to address 0, with the write enable line asserted. The test value may be any desired value, although a preferred embodiment envisions a test value comprising all 1's. If the write operation is successful, the write pointer is located at address 1 following Stage 2.

Stage 3 of the test initiates a pair of concurrent read and write operations in the FIFO. During the operations of Stage 3, however, only the read enable line is asserted; the write enable line is deasserted. Accordingly, the FIFO should execute the read operation only, and not the write operation. If the FIFO executes the write operation, then a fault has occurred in the write enable line and will be detected during Stage 4, below. Following Stage 3, the read and write pointers both should be located at address 1. Further, the FIFO should set the empty flag, because the number of read operations since reset equals the number write operations. If the write operation executes, however, then the write pointer will be located at address 2, and the empty flag will not be set.

In Stage 4, the test initiates a read operation with the read enable asserted. If the empty flag is set, the FIFO will not execute the read operation. Depending on the FIFO implementation, an unsuccessful read operation will either tristate the read bit lines or drive the read bit lines with the previously read value, or all 1's in a preferred embodiment. If the write operation in Stage 3 was successful, however, then the empty flag will not be set, and the read operation will return all 0's from address 1. By setting the test write value in Stage 3 to the complement of the test write value in Stage 2, a change in the read bit lines during Stage 4 indicates a fault in the write enable line. Thus, if the read operation of Stage 4 returns a value of all 1's or if the read bit lines are tristated, then no fault is detected. If the read operation returns a value of all 0's, however, then a fault is exposed in the write enable line.

Next, during Stage 5 the test executes a write operation, with the write enable line asserted. The test value preferably comprises the complement of the test value from Stage 2, or all 0's in a preferred embodiment. Note that the write operation clears the empty flag. Following Stage 5, the write pointer increments to address 2, assuming no fault was detected during Stage 4. Stage 6 then executes a retransmit command, transferring the read pointer to address 0. The write pointer is unaffected by the retransmit command, however, and remains at address 2.

Stage 7 then initiates a read operation in the FIFO, with the read enable line deasserted. Because the read enable line is deasserted, the FIFO should not execute the read operation. Thus, the read pointer remains at address 0. Note that if the FIFO executes the read operation, the read pointer will increment to address 1.

Finally, Stage 8 comprises a read operation with the read enable line asserted. If the read operation from Stage 7 did not occur, then the read pointer will be located at address 0, and the FIFO will drive the read enable lines to the value stored at address 0 (which is preferably all 1's). Note that if the read operation improperly executed during Stage 7, then the read operation in Stage 8 will return the value stored at address 1 during Stage 5, or all 0's. Thus, if the read operation of Stage 8 returns all 0's or if the FIFO drives the read bit lines to tristate levels, then a fault in the read enable lines is detected. If the read operation of Stage 8 returns all 1's, however, then the Enable Line Test ends without failure. Note that the Enable Line Test is not strictly necessary to detect faults that prevent read and write operations when the read and write enable lines are asserted, since these faults can be detected with virtually any test. The Enable Line Test is particularly useful, however, for detecting faults that improperly permit read and write operations when the read and write enable lines are not asserted.

Figure 6:
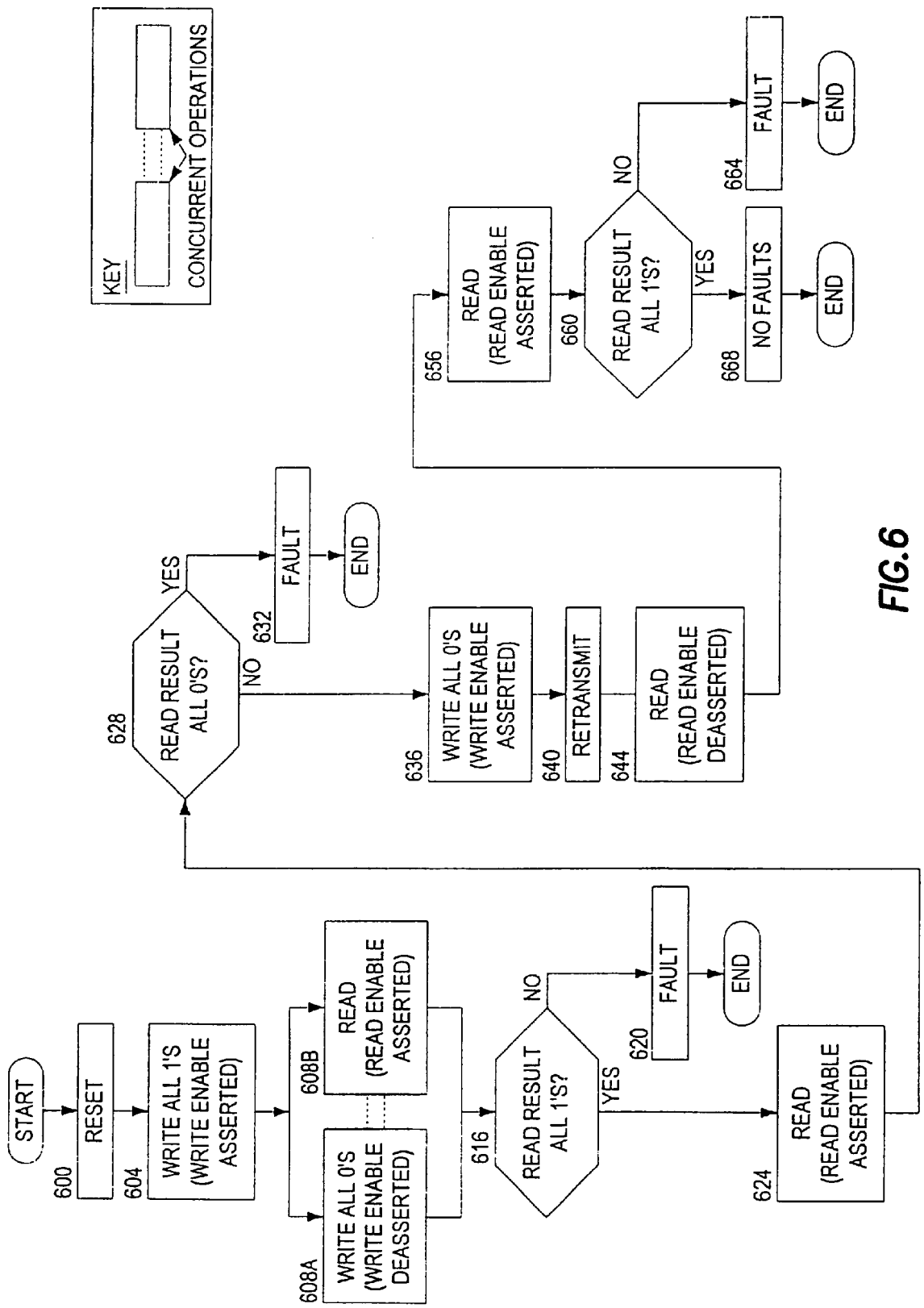
FIG. 6 illustrates the flowchart of a write enable and read enable test in accordance with a preferred embodiment.

FIG. 6 illustrates the flowchart of a preferred embodiment of the Enable Line Test, as summarized in Table VIII. Beginning with block 600, a reset command is issued to set the read and write pointers to address 0. Next, in block 604, Stage 1 of the test performs a write operation, with the write enable line asserted. In accordance with a preferred embodiment, the test write value comprises all 1's. Following the write operation, the FIFO increments the write pointer to address 1 and clears the empty flag.

Next, Stage 3 initiates concurrent read and write operations in blocks 608A–B. As shown in block 608A, however, the write enable line is deasserted to prevent the write operation. In contrast, the read enable line is asserted, enabling the read operation in block 608B. Accordingly, the FIFO should execute only the read operation, thereafter incrementing the read pointer to address 1. With both pointers at address 1, the FIFO should then set the empty flag. If the read operation fails to return the data value of all 1's from address 0 (block 616), then the test ends with a fault condition (block 620). If the read operation returns all 1's, however, then the test continues with Stage 4.

Beginning with block 624, Stage 4 executes a read operation with the read enable asserted. If the write operation was successfully prevented by disabling the write line in Stage 3, then the empty flag will be set prior to Stage 4, preventing the read operation. If the read operation is prevented, then the read bit lines either will become tristated or will hold the value of the previous read operation, or all 1's. If the read operation executes, however, then the FIFO will drive the read bit lines to all 0's. Thus, if the read operation returns all 0's, then the test ends with a fault condition at block 632. Otherwise, the test continues with Stage 5, in block 636.

As shown in block 636, the Enable Line Test next performs a write operation, with the write enable line asserted, at memory location 1. Following the write operation, the FIFO will increment the write pointer to address 2 and clear the empty flag. Next, in Stage 6 (block 640), a retransmit command is executed, setting the read pointer to address 0.

Stage 7 initiates a read operation with the read enable line deasserted, in order to prevent the read operation from occurring (block 644). Note that the read pointer increments to address 1 if the read operation improperly executes, or the read pointer remains at address 0 if the read operation does not execute. As shown in block 656, which implements Stage 8, a read operation next is executed with the read enable line asserted. Because the read enable is asserted, the read operation should successfully return the value at address 0, which comprises all 1's. Thus, if the read operation returns a value of all 1's (block 660), the test ends at block 668 with no faults. If the read operation fails to return all 1's, however, then the test ends with a fault condition at block 664.

Accordingly, the Enable Line Test detects faults in the read enable and write enable lines, including (1) read operations occurring when the read enable line is not asserted, (2) read operations failing to occur when the read enable line is asserted, (3) write operations occurring when the write enable line is not asserted, and (4) write operations failing to occur when the write enable line is asserted. Note that although Stages 1–8 are realizable as a cohesive algorithm that tests both enable lines, certain stages may be omitted in order to test either the write enable line or the read enable line individually.

Reset and Retransmit Test

Table IX, below, summarizes the preferred embodiment of a Reset and Retransmit test that detects faults in the reset and retransmit operations of a FIFO. Note that, as in the interport FIFO test, the FIFO data may be accessed in bytes, nibbles, or any number of bits, including one bit, during the reset and retransmit test. Accordingly, the variable N should be interpreted in accordance with the chosen data size. In a preferred embodiment, the memory is accessed in words, and thus N represents the number of words in the memory.

TABLE IX

Reset and Retransmit Test.

| Stage | Write Address Range | Write Value | Read Address Range | Read Value |
|---|---|---|---|---|
| 1 | | Reset | | |
| 2 | 0 to N-1 | All 1's | None | None |
| 3 | | Reset | | |
| 4 | 0 | All 0's | None | None |
| 5 | | Reset | | |
| 6 | 0 | All 1's | None | None |
| 7 | None | None | 0 | All's |
| | | For K = 1 to N-1: | | |
| 8 | | Reset | | |
| 9 | 0 | All 0's | None | None |
| 10 | 1 | All 1's | 0 | All 0's |
| 11 | 2 to K | All 1's | 1 to K-1 | All 1's |
| 12 | | Retransmit | | |
| 13 | None | None | 0 | All 0's |
| 14 | None | None | 1 to K-1 | All 1's |
| 15 | | Reset | | |
| 16 | 0 | All 1's | None | None |
| 17 | 1 | All 0's | 0 | All 1's |
| 18 | None | None | 1 | All 0's |

Stage 1 of the reset and retransmit test comprises a reset operation that sets the read and write pointers to address 0. Next, in Stage 2, the test writes a series of test values to all of the memory addresses, from address 0 to address N-1. The test values preferably comprise all 1's, although any test value is acceptable. In Stage 3, the test performs a reset operation to relocate the write pointer to address 0. Thus, following Stage 3, the memory will be initialized to all 1's, and the read and write pointers will be located at address 0. As an alternative to the reset operation in Stage 3, a command may be sent to the FIFO to clear the full flag (which will be set after the write operations of Stage 1), if such a command is available.

Stages 4 and 5 verify that the write pointer will reset from address 1. In Stage 4, the test performs a write operation at address 0, thereby setting the write pointer to address 1. The test value for the write operation is the complement of the test value written to address 0 during Stage 2, or all 0's in a preferred embodiment. Next, the test performs a reset operation in Stage 5, followed by a write operation to address 0 in Stage 6. The write operation in Stage 6 stores the complement of the test value stored in Stage 4, or all 1's in a preferred embodiment. In Stage 7, the test performs a read operation at address 0. If the reset operation in Stage 5 failed to relocate the write pointer from address 1 to address 0, then the value of the memory at address 0 will be all 0's instead of all 1's, as written in Stage 6. Thus, if the read operation fails to return all 1's in Stage 7, then a fault has occurred.

Following Stage 7, Stages 8–18 are executed repeatedly, or one time for each memory address from 1 to N-1. As shown in Table IX, the variable K is used to represent each iteration of Stages 8–18. As will be described below, the $K_{th}$ test iteration verifies that the FIFO can relocate the read pointer from address K to address 0 and can relocate the write pointer from address K+1 to address 0.

Beginning with Stage 8, the test executes reset operation, followed by a write operation in Stage 9. In a preferred embodiment, the test write value in Stage 9 comprises the complement of the test value in Stage 2 (i.e., all 0's). Note that the FIFO will increment the write pointer to address 1 following Stage 9 and that the read pointer remains at address 0.

Stage 10 comprises a write operation executed concurrently with a read operation. The write test value in Stage 10 is formed as the complement of the test value from Stage 9. Thus, in a preferred embodiment, the test value in Stage 10 comprises all 1's. The read operation verifies the test word written during Stage 9, or all 0's in a preferred embodiment. Thus, if the read operation does not return all 0's, then the test has exposed a memory fault. The test preferably ends after discovering a fault, although the test may continue for any reason, such as to count the total number of faults. Following Stage 10, the write pointer is located at address 2, and the read pointer is located at address 1.

Stage 11, which comprises a series of concurrent read and write operations, is executed only if K>1. The write operations are performed from address 2 to address K, and each read operation is performed at an address lower than the concurrent write operation, or from address 1 to address K-1. Note that Stage 11 includes a single operation if K=2. Following Stage 11, the write pointer is located at address K+1, and the read pointer is located at address K. Note that the read and write operations in Stages 10–11 may be executed separately if desired, although concurrent operations expedite the test and thus are preferred.

Stage 12 is executed for all values of K; thus, if K=1, the test enters Stage 12 after executing Stages 1–10. Otherwise, the test enters Stage 12 after implementing Stages 1–11. Just after Stage 11, the read pointer is located at memory address K, and the write pointer is located at address K+1. Stage 12 executes a single retransmit operation, returning the read pointer to address 0. Stage 12 thus tests the ability of the FIFO to (1) clear the read pointer from address K and (2) set the read pointer to address 0.

Just prior to Stage 13, the read pointer is located at address 0, and each of the values from memory address 1 to memory address K comprises the complement of the value stored in memory address 0. In a preferred embodiment, memory address 0 contains a value of all 0's, and thus the remaining memory locations, from address 1 to address K, contain all 1's. Stage 13 executes a read operation. If the read pointer was correctly set to address 0 during Stage 12, then the read operation will return the test word of all 0's. If the read pointer remained at address K and did not move to address 0, then the read operation may return all 1's, indicating a retransmit failure. Alternatively, if the read pointer moved to address 0 but the shift register failed to clear the pointer from address K, then the read operation caused the FIFO to read from both memory. locations, resulting in a bit line conflict between the test word of all 0's at address 0 and the test word of all 1's at address K. If the bit line conflict behaves as an OR-type short, then the resulting output value will be all 1's, and the fault will be exposed. Another type of fault may occur if the read pointer clears from address K but fails to set at address 0. Consequently, the read operation will fail to drive the bit lines, exposing the retransmit fault.

Stage 14 executes a series of read operations from address 1 to address K-1 that verify the test values written during Stages 10–11. In accordance with a preferred embodiment, the read operations should return all 1's unless a fault is present. Following Stage 14, the read pointer is located at address K, and the write pointer is located at address K+1.

Next, Stage 15 implements a reset operation that relocates the read and write pointers to address 0. Accordingly, Stage 15 tests the ability of the FIFO to reset the write pointer from address K+1 and to reset the read pointer from address K at the same time. The reset operation (1) clears the write pointer from address K+1, (2) sets the write pointer to address 0, (3) clears the read pointer from address K, and (4) sets the read pointer to address 0.

Next, Stage 16 executes a write operation at address 0. The value of the write operation preferably is the same as the value of the write operation executed in Stage 2. Thus, in accordance with a preferred embodiment, the write value comprises all 1's. Following Stage 10, the read pointer is located at address 0, and the write pointer is located at address 1.

Stage 17 then implements a pair of concurrent read and write operations. The write operation, which occurs at address 1, stores the complement of the value written to address 0 in Stage 16, or all 0's. The read operation in Stage 17 verifies the value of all 1's written to address 0 in Stage 16. Thus, if the read operation fails to return all 1's, then a fault is detected. Note that the read and write operations of Stage 17 may be executed separately instead of concurrently if desired. In Stage 18 the test performs a read operation at address 1 to verify the value of all 0's written during Stage 17. Thus, if the read operation fails to return all 0's, then a fault is detected. If the read operation returns all 1's and if no other faults have been detected during previous stages, then the reset and retransmit test ends with no faults.

Depending on the type of memory technology used to construct the FIFO, the reset and retransmit test of Table IX will activate and detect either AND-type faults or OR-type faults. To ensure detection of both AND-type and OR-type faults, the test preferably is run twice. During the second test execution, the read and write data are complemented. Thus, The write operations in Stages 2, 6, 10, 11, and 16 comprise test values of all 0's instead of all 1's, and the write operations in Stages 4, 9, and 17 comprise test values of all 1's instead of all 0's. Accordingly, read operations in Stages 7, 11, 14, and 17 verify all 0's instead of all 1's, and the read operations in Stages 10, 13, and 18 verify all 1's instead of all 0's.

Figure 7C:
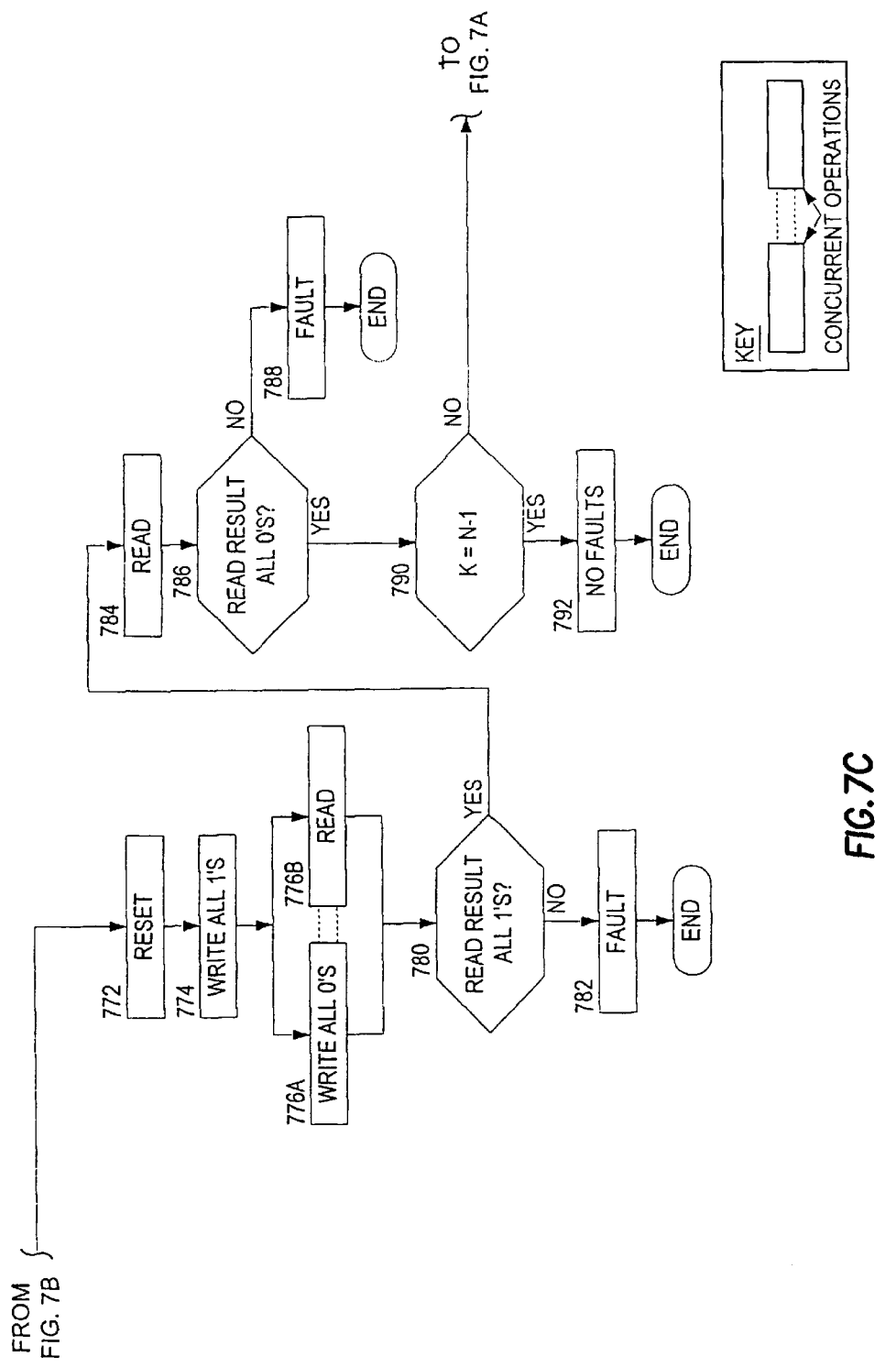

FIGS. 7A–C illustrate a flowchart of the first execution of the reset and retransmit test. Note that a second execution involves the same procedures with complemented data values. Referring initially to FIG. 7A, block 700 executes the reset command of Stage 1. Block 702–708 illustrate Stage 2, which initializes the memory words to all 1's. Beginning in block 702, the opcount variable is set to zero. Next, in block 704, the test writes all 1's to the FIFO. As shown in block 706, if opcount is less than N−1, then the opcount variable increments (block 708), and Stage 2 returns to block 704. If opcount equals N−1 in block 706, then the test proceeds to Stage 3.

Block 710, a reset command, represents Stage 3. Thus, the read and write pointers are reset to address 0 in Stage 3. During Stage 4 (block 712) the test writes a test word of all 0's to the FIFO. Because the write pointer is reset just prior to Stage 4, the write operation occurs at address 0. Accordingly, the memory word at address 0 comprises all 0's, and the remaining memory words comprise all 1's (as written during Stage 2). In Stage 5, the test again resets the read and write pointers (block 714). Blocks 716 and 718 represent Stages 6 and 7, respectively. In Stage 6, the test writes a test value of all 1's to the FIFO, and in Stage 7 the test performs a read operation. Because the read and write pointers were reset just prior to Stage 6, the write and read operations of Stages 6–7 both occur at address 1. If the read operation of Stage 7 fails to return the test value of all 1's written during Stage 6 (block 720), then the test ends in a fault condition (block 722).

Note that the read operation of Stage 7 verifies that the write pointer can be successfully reset from address 1 to address 0. After writing all 0's to address 0 during Stage 4, the pointer advances to address 1. Thus, the reset operation in Stage 5 should reset the write pointer from address 1. If the write pointer remains at address 1 after Stage 5, then the write operation of Stage 6 will occur at address 1 instead of address 0, and the read operation of Stage 7 will return all 0's instead of all 1's.

As explained above, the reset and retransmit test executes Stages 8–18 at each memory address, from address 1 through address N−1 (the highest memory address). Thus, block 724 next initializes a loop variable K equal to 1 to represent initial memory address. As shown in block 728, Stage 8 resets the read and write pointers to address 0. In Stage 9 (block 730), the test writes all 0's to the FIFO. Note that the write pointer increments to address 1 following Stage 9. In Stage 10, shown in blocks 732A–B, the test executes a pair of concurrent read and write operations. The write operation in block 732A stores all 1's into the FIFO at address 1, which increments the write pointer to address 2. The read operation in block 732B verifies the test value of all 0's written to address 0 during block 730. Thus, if the read operation fails, to return all 0's (block 734), then the test ends in a fault condition. Otherwise, if the read operation returns all 0's, then the test proceeds to Stage 11, as shown in FIG. 7B.

Now referring to FIG. 7B, the test continues with Stage 11, unless K equals 1 (block 738). Note that if K equals 1, then the test jumps to Stage 12, as shown in block 752. Stage 11 is illustrated in blocks 740–750. Stage 11 comprises a series of concurrent read and write operations. The opcount variable is used to track the number of iterations. Beginning with block 740, the opcount variable is set to 2, which corresponds to the current location of the write pointer. Next, the test performs a write operation in block 742A, using the same test word used in Stage 2, which represents the complement of the test word from Stage 4. Thus, the test value comprises all 1's in Stage 11. Concurrently with the write operation, the test executes a read operation in block 742B to verify the value of the previously written memory location. Because the read operations start at address 1, which is the location of the read pointer just prior to Stage 11, the read operations should return all 1's. Thus, if any read operation fails to return all 1's (block 744), the test ends with a fault (block 746). Otherwise, unless opcount equals K (block 748), the test increments opcount in block 750 and begins the next iteration of Stage 11 with blocks 742A–B. If opcount reaches the value of K in block 748 and no faults have occurred, then Stage 12 begins in block 752.

Stage 12 may start either after block 738 (if K=1) or after block 748 (if K>1). Just prior to Stage 12, the write pointer is located at address K+1, and the read pointer is located at address K. Stage 12 implements a retransmit command, however, as shown in block 752. If the retransmit command works properly, then the FIFO clears the read pointer from address K and sets the read pointer to address 0. Note that the write pointer remains at address K+1 following the retransmit command. The test then advances to Stage 13.

FIG. 7B illustrates Stage 13 in blocks 754–758. Block 754 comprises a read operation. If the retransmit operation successfully cleared the read pointer from address K and set the read pointer to address 0 during Stage 6, then the read operation will retrieve the value at memory location 0, which comprises all 0's, and then increment the read pointer to address 1. If the retransmit command set the pointer to address 0 but failed to clear the pointer from address K, then the read command in block 754 will activate both memory locations 0 and K. Because memory location K comprises all 1's, performing a read operation at both locations simultaneously will result in a bit line conflict. Unless the bit line conflict resolves to all 0's (block 756), the read operation will fail to return the value written to address 0, and the fault will be detected (block 758). Alternatively, the retransmit command may clear the pointer from address K but fail to set the pointer at address 0. Consequently, the no memory location will activate in response to the read operation of block 754, and the FIFO will fail to drive any value onto the read bit lines. If the FIFO fails to drive the read bit lines to all 0's (block 756), then the 5 test ends in a fault condition in block 758. If the read result successfully returns all 0's in block 756, then the test implements Stage 14, as shown in blocks 760–770.

Stage 14 executes a series of read operations, from the location of the read pointer at address 1 up to address K−1. First, the variable opcount is set to 1 in block 740, corresponding to the first read address. Next, in block 762, the test executes a read operation at the current location of the read pointer. If the read result fails to return a value of all 1's (block 764), then a fault is declared in block 766, and the test ends. Otherwise, unless the value of opcount has reached K−1 (block 768), the test increments opcount in block 770 and returns to block 762 for rip another iteration. If opcount reaches the value of K−1 in block 768 without a fault occurring, then the test advances to Stage 15. After the final read operation of Stage 14, the read pointer is located at address K.

Referring now to FIG. 7C, Stage 15 executes a reset operation, as shown in block 772. The reset operation clears the read pointer from address K and the write pointer from address K+1, setting the read and write pointers to address 0. Next, the test writes all 1's to the FIFO at address 0, during Stage 16 (block 774). Stage 17, shown in blocks 776–782, comprises a pair of concurrent read and write operations. The write operation (block 776A) writes a test value of all 0's to the FIFO, at address 1, while the read operation (block 776B) verifies the test value of all 1's written to address 0 during the previous stage. If the read result fails to return all 1's (block 780), then the test ends with a fault condition (block 782). Otherwise, the test proceeds to Stage 18.

In Stage 18, the memory test performs another read operation (block 784) to verify the test value of all 0's written to the FIFO during Stage 17. Thus, if the read operation fails to return all 0's (block 786), then the test ends with a fault condition at block 788. If the read operation successfully returns all 0's (block 786), then the test continues as long as K does not equal N−1 (block 790). If K is less than N−1, then flow returns to FIG. 7A, where the value of K is incremented (block 726). After incrementing K in block 726, the memory test continues with the reset operation of Stage 8 (block 728). If K equals N−1 in block 790, however, then the test completes in block 792 with no faults detected.

Accordingly, the reset and retransmit test detects faults in the reset and retransmit operations throughout the array, from memory location 1 to memory location N−1. Note that the reset and retransmit test comprises a single algorithm, in order to efficiently test for faults in the reset and retransmit operations. In an alternative embodiment, a subset of the test may be used to test either the reset operation or the retransmit operation alone.

Figure 8:
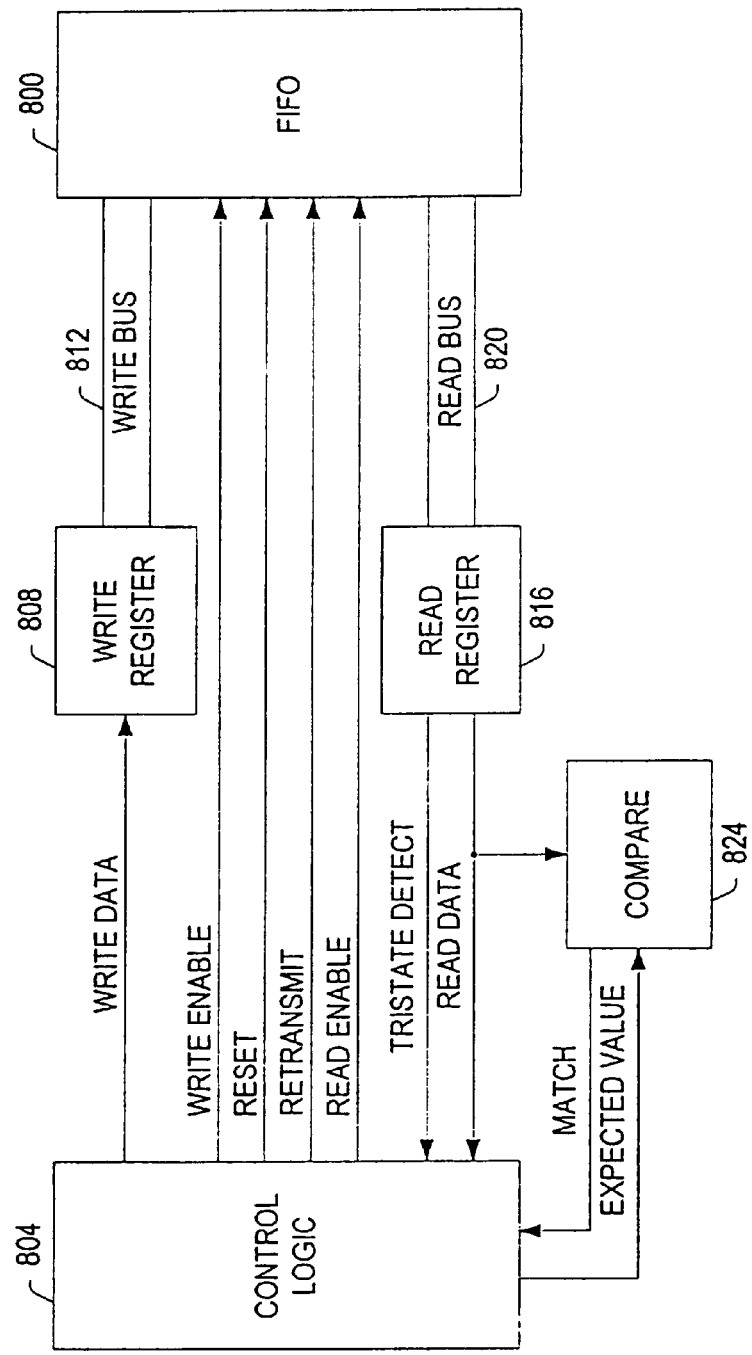
FIG. 8 illustrates a preferred embodiment of a memory test circuit that executes the tests shown in FIGS. 4A–D, 5, 6, and 7A–B.

Now referring to FIG. 8, a testing circuit that implements the tests outlined above is shown coupled to an exemplary FIFO memory 800. The FIFO testing circuit of FIG. 8 includes a control logic device 804 coupled to a variety of components, including a write register 808, a read register 816, and a comparator 824. The testing circuit preferably comprises an external, dedicated testing machine that is manufactured separately from the memory array and coupled to the FIFO to execute the test. Alternatively, the testing circuit may be integrated with the FIFO and configured to implement a Built In Self Test (BIST) procedure, or the testing circuit may comprise a programmable computer.

The control logic 804 provides a write data signal that loads the write register 808 and receives a read data signal that indicates the value stored in the read register 816. The write register 808 and read register 816 couple to the FIFO 800 via a write bus 812 and a read bus 820, respectively. Thus, the write register 808 submits test write values to the FIFO 800 via the write bus 812 during write operations, and the read register 816 receives values read from the FIFO 800 over the read bus 820. In addition to the read data signal, the read register 816 also provides a tristate detect line to the control logic 804 which, when asserted, indicates that the read value received over the read bus 820 included at least one tristate value (i.e., a voltage level that is between a logic-1 value and a logic-0 value). The control logic 804 also provides a expected value signal to the comparator 824, and the comparator 824 generates a match signal to the control logic 804. In addition, the control logic 804 operates various control lines to the FIFO, including the reset and retransmit lines, the write enable line, and the read enable line. Note that although only the write enable, reset, retransmit, and read enable control lines are depicted in FIG. 8, one of ordinary skill in the art would recognize that other control lines might be present.

The comparator 824 receives and stores a data value from the control logic 804 via the expected value signal, and also receives and stores the value of the read data lines from the read register 816. The comparator 824 asserts the match signal to the control logic 804 if the value of the expected value signal matches the value of the read data signal, or deasserts the match signal to the control logic 804 if the value of the expected value signal does not match the value of the read data signal. Note that the comparator 824 may comprise a distinct logic unit that compares data values, as shown in FIG. 8, or may represent an execution unit implemented within the control logic 804 and controlled by software instructions. In addition, the comparator 824 is not required to store the values of the read data and expected value lines; instead, the comparator 824 may operate as a conventional asynchronous combinatorial logic or comparison circuit.

The control logic 804 comprises a logic circuit capable of implementing a state machine to generally manage read and write operations, including loading the write register 808 with write test values, monitoring the value of the read register 816, and accessing the comparator 824. The control logic 804 preferably comprises a programmable device, such as a microprocessor, along with one or more memory devices to store program instructions (i.e., a flash ROM) and/or temporary data operands that implement the FIFO fault tests disclosed above. If desired, however, the control logic 804 may comprise a nonprogrammable device, such as a hardwired integrated circuit, or even discrete logic. The control logic 804 also may include I/O circuitry, such as read/write buffers and parallel/serial bus interfaces, in order to communicate with an external device, such as a computer workstation or network.

To perform a write operation to the FIFO 800, the control logic 804 loads the write register 808 with the write value and then asserts the write enable signal, along with any other control signals that may be necessary to perform a write operation. The FIFO 800 then accepts the write value from the write register 808 over the write bus 812. To perform a read operation in the FIFO 800, the control logic asserts the read enable signal and any other necessary control signals, and the FIFO 800 responds by loading the read value into the read register 816 via the read bus 820. As shown in FIG. 8, the control logic receives the read data from the read register 816 via a read data signal. The read register 816 preferably includes comparator circuitry that determines whether or not the values read from the FIFO 800 are tristate values. If at least one read value represents a tristate level, then the read register 816 asserts the tristate detect signal to the control logic 804.

Because the memory tests disclosed herein, including the interport test, the flag test, the enable line test, and the reset/retransmit test may be accomplished using only read and write commands, the control logic 804 is capable of implementing any of the tests by managing the read register 816, the write register 808, and the control lines to the FIFO 800. To verify the results of each read operation (for example in blocks 410, 414, and 420 of FIG. 4A), the control logic 804 places the expected value of each read operation into the comparator 824 via the expected value lines, either just before or just after the read operation. If the read operation returns the expected data value (which will be carried to the comparator 824 over the read data lines), then the comparator 824 asserts the match signal. Hence, the control logic 804 can determine whether a read operation is successful or unsuccessful and can implement the test accordingly.

To implement the interport test of Table VI, for example, the control logic 804 performs a series of N−2 write operations using a test value of all 0's (Stage 1), followed by two concurrent read/write operations (Stage 2) using a test write value of all 0's, a series of N concurrent read/write operations using a test write value of all 1's (Stages 3–4), a series of N−2 concurrent read/write operations using a test write value of all 0's (Stage 5), and then two write operations using a test word of all 0's (Stage 6). Note that the control logic 804 does not have to provide the address for each read operation and each write operation, since the FIFO 800 determines the actual read and write locations. Next, the control logic 804 asserts the reset line to relocate the read and write pointers (Stage 7), executes a write operation using a test word of all 1's (Stage 8), and the performs a series of N−2 concurrent read/write operations using a test write value of all 1's (Stage 9), a series of N concurrent read/write operations using a test write value of all 0's (Stages 10–12), and two concurrent read/write operations using a test write value of all 1's (Stages 13–14).

Along with each read operation, the control logic 804 loads the comparator with the expected read value and then monitors the match line to determine if the read was successful. Along with the read operation in block 408B of the interport test, for example, the control logic 804 implements block 410 of the interport test by loading the comparator with a test value of all 0's. If the read operation returns all 0's, then the comparator 824 asserts the match line, and the control logic 804 continues with blocks 412A–B of the test. If the comparator 824 holds the match line low, however, indicating that the read result does not equal all 0's, then the control logic 804 ends the test with a fault condition in block 411.

The control logic 804 implements the flag test similarly, by running the sequence of memory operations in Table VII to the FIFO 800 and using the comparator 824 to verify the read results. To execute the flag test of Table VII, the control logic first asserts the reset line to relocate the read and write pointers to address 0 (Stage 1), performs a series of N−1 write operations using a test value of all 0's (Stage 2), and then writes a test value of all 1's (Stage 3). Because the full flag should be set following Stage 3, the FIFO 800 should not execute further write operations. Nonetheless, the control logic 804 attempts another write operation in the FIFO 800 in Stage 4 by loading the write register 808 with a test value of all 1's and then asserting the write enable line, along with any other necessary control lines to initiate a write operation in the FIFO 800.

Next, the control logic 804 performs a read operation to verify the value written to address 0 of the FIFO 800. If the FIFO 800 executed the write operation in Stage 4, then the read operation of Stage 5 will return a write word of all 1's, and the control logic 804 will end the test with a fault condition. If the FIFO 800 did not execute the write operation in Stage 4, then the FIFO 800 should load all 0's into the read register 816. The control logic 804 verifies the contents of the read register 816 by loading all 0's into the comparator 824. If the FIFO 800 returns all 0's, then the comparator 824 asserts the match line, and the test continues. If the contents of the read register 816 do not contain all 0's, perhaps indicating that the write operation occurred in Stage 4, then the comparator 824 deasserts the match signal, prompting the control logic 804 to end the test with a fault condition.

Next, the control logic performs a series of N read operations (Stages 5–7) to verify the data values written during Stages 2–3. After Stage 7, the FIFO 800 should set its empty flag and should not permit further read operations. Finally, in Stage 8 the control logic attempts a final read operation by asserting the read enable line and any other necessary control lines. Because the FIFO 800 is empty following Stage 7, however, the FIFO 800 should not execute the read operation. Accordingly, the FIFO 800 should either tristate the read bus 820 or drive the read bus 820 with the value of the last read operation (all 1's, in Stage 7). If the FIFO 800 refuses to execute the read operation and tristates the read bus 820, then the read register 816 asserts the tristate detect signal. Thus, the control logic 804 ends the flag test without fault if the tristate detect signal is asserted. If the FIFO 800 does not tristate the read bus 820, then the control logic 804 checks the value of the read operation by loading the comparator 824 with all 0's. If the FIFO 800 drives the read bus 820 with all 0's, indicating that the read operation was performed, then the comparator 824 asserts the match signal. If the FIFO 800 refuses to execute the read operation, however, then the read bus 820 will carry a value other than all 0's, and the match signal will become deasserted. Thus, the control logic 804 ends the test with a fault condition if the match signal is asserted or ends the test without a fault condition if the match signal is deasserted.

For the read/write enable test, the control logic manipulates the read and write registers as if performing actual read and write operations. During some stages, however, the control logic 804 keeps the read enable or write enable signal deasserted, as outlined in Table VIII, to determine if the FIFO 800 executes operations when the enable lines are low. During Stage 1, for example, the control logic 804 asserts the reset line to relocate the read and write pointers to address 0. Next, the control logic 804 loads the write register 808 with a test write value of all 1's and executes a write operation with the write enable line asserted (Stage 2), and then performs a concurrent read/write operation using a test write word of all 0's (Stage 3). During Stage 3 the control logic 804 asserts the read enable signal but keeps the write enable deasserted, to prevent the FIFO 800 from executing the write operation. During Stage 4, the control logic performs a read operation with the read enable line asserted. If the FIFO 800 executed the write operation of Stage 3, then the FIFO 800 will return a test value of all 0's to the read register. If the FIFO 800 did not execute the write operation of Stage 3, however, then the FIFO 800 either will tristate the read bus 820 or supply another value to the read bus 820. Thus, if the control re logic 804 receives an asserted tristate detect signal from the read register 816, the test continues without a fault condition. If the tristate detect signal is deasserted, however, then the control logic 804 loads the comparator 824 with the test value of all 0's and ends the test with a fault condition if the match line is asserted.

If no fault condition is detected, then the control logic 804 continues in Stage 5 by writing all 0's to the FIFO 800 via the write register 808, with the write enable line asserted, next asserting the retransmit signal to relocate the read pointer to address 0 in Stage 6. The control logic 804 then attempts a read operation with the read enable line deasserted (Stage 7). If the FIFO 800 refuses to execute the read operation of Stage 7, then the FIFO 800 will either tristate the read bus 820 or hold the read bus at all 0's (the value of the last read operation in Stage 4). Thus, if the read register 816 asserts the tristate detect line to the control logic 804, then the test ends without a fault condition. If the tristate detect line is deasserted, however, then the control logic 804 checks the read value by loading the comparator with all 1's. If the FIFO 800 executes the read operation, returning all 1's, then the comparator 824 will assert the match signal. If the read bus 820 holds all 0's, however, indicating that the read operation did not execute, then the comparator 824 will deassert the match signal. The control logic 804 then completes the test by performing read operation with the read enable signal asserted and verifying, via the comparator 824, that the read operation returned all 1's. If the read operation returns all 0's, then the read operation did not return the value stored at address 0, and thus a fault occurred.

The control logic 804 performs the reset and retransmit test by executing the operations in Table IX, above. The control logic 804 implements the test by resetting the read and write pointers to address 0 (Stage 1), performing a write operation using a test word of all 1's (Stage 2) to each memory location, performing another reset operation (Stage 3), writing a test value of all 0's (Stage 4), performing a third reset operation (Stage 5), writing all 1's to the FIFO (Stage 6), and then performing a read operation to verify the test value of all 1's (Stage 7). Next, the control logic 804 repeats Stages 8–18 a total of N−1 times. Preferably, the control logic 804 maintains a count variable K to track each iteration. For a given value of K, the control logic first performs reset operation (Stage 8), writes a test word of all 0's (Stage 9), and then performs a concurrent read/write operation, using a test value of all 1's for the write operation (Stage 10). Next, if K is greater than 1, the control logic 804 executes a number of concurrent read/write operations from address 2 to address K, using a test value of all 1's for each write operation (Stage 11).

Following Stage 11, the control logic 804 executes Stages 12–18 for all values of K. Beginning with Stage 12, the control logic 804 asserts the retransmit signal to relocate the read pointer to address 0. The control logic 804 then performs K read operations to verify the memory contents (Stages 13–14). Note that the control logic 804 verifies the results of the read operations using the comparator 824, as described above. Next, in Stage 15, the control logic 804 resets the read and write pointers to address 0 and then performs a write operation using a test write word of all 1's (Stage 16). In Stage 17, the control logic 804 performs a concurrent read/write operation, using a test word of all 0's for the write operation. Finally, the control logic performs a read operation in Stage 18 to verify the value of all 0's written during Stage 17. Because the read pointer should be reset to address 0 prior to Stage 15, and because the write pointer should have directed the write operation of all 1's to address 0 in Stage 16, the read operation of Stage 17 should return all 1's. Accordingly, if the FIFO 800 fails to return all 1's to the read register 816 in response to the read operation of Stage 17, then the control logic 804 ends the test with a fault condition. Similarly, the control logic 804 ends the test with a fault condition if the read operation of Stage 18 fails to return all 0's.

It should be noted that the operations of the interport test, flag test, enable line test, and reset/retransmit test may be combined to implement multiple tests at the same time. Certain read and write operations in the interport test may be attempted with the read and/or write enable lines deasserted, for example, to test for enable line faults during the interport test. Numerous other combinations will be apparent to one of ordinary skill in the art upon reading this disclosure. If implemented separately, however, then it should be noted that the tests may be implemented in any desired order.

Accordingly, the method and apparatus disclosed herein provide an efficient and reliable technique for detecting faults which occur in FIFO's, including control faults which are specific to FIFO's, as well as faults common to conventional memories, such as interport faults and faults that occur in single port memories. Further, the faults are detected without directly observing internal values within the FIFO, such as the full and empty flag values and the shift register values. Numerous variations and modifications will become apparent to those skilled in the art once the above disclosure is fully appreciated. It is intended that the following claims be interpreted to embrace all such variations and modifications.

We claim:

1. A method of testing for faults in a pointer-based FIFO capable of executing concurrent read and write operations to a plurality of memory locations, the memory locations consisting of a first plurality of memory locations and a second plurality of memory locations, comprising:
    (a) writing predetermined data values to the first plurality of memory locations;
    (b) writing predetermined data values to the second plurality of memory locations;
    (c) performing a series of read operations to the first plurality of memory locations, the series of read operations executing concurrently with a write operation in (b) and at a fixed number of memory addresses away from the concurrent write operation; and
    (d) determining whether each read operation in (c) returns a predetermined data value written during (a).

2. The method of claim 1, wherein a single test value is used for each of the write operations in (a) and (b).

3. The method of claim 2, wherein the FIFO comprises a number N of memory addresses, and wherein each read operation in (c) occurs N−2 addresses lower than the concurrent write operation in (b).

4. The method of claim 3, including:
(e) forming a complement of the single test value;
(f) writing the complement to the first plurality of memory locations;
(g) writing the complement to the second plurality of memory locations;
(h) performing a series of read operations to the first plurality of memory locations, the series of read operations executing concurrently with a write operation in (g) and at a fixed number of memory addresses away from the concurrent write operation; and
(i) determining whether each read operation in (h) returns the complement.

5. The method of claim 4, wherein each read operation in (h) occurs two addresses higher than the concurrent write operation in (g).

6. The method of claim 5, wherein the test value comprises all 0's.

7. The method of claim 2, wherein each read operation in (c) occurs two addresses higher than the concurrent write operation in (b).

8. The method of claim 2, wherein each read operation in (c) occurs one address lower than the concurrent write operation in (b).

9. A method of testing for faults in a FIFO, the FIFO designed to prevent write operations if the FIFO is full, comprising:
writing a test value to a test location in the FIFO;
writing values into the FIFO until the FIFO is full;
forming a complement of the test value;
when the FIFO is full, initiating a write operation in the FIFO to replace the test value with the complement of the test value at the test location; and
performing a read operation to determine whether the test location contains the test value or the complement.

10. The method of claim 9, including writing the complement to the highest address in the FIFO, and wherein the test location is located at the lowest address in the FIFO.

11. The method of claim 10, including:
performing read operations until the FIFO is empty;
initiating a read operation after the FIFO is empty; and
determining whether the FIFO performs the read operation after the FIFO is empty.

12. The method of claim 11, wherein determining whether the FIFO performs the read operation after the FIFO is empty comprises determining whether the FIFO returns the test value or the complement in response to initiating the read operation after the FIFO is empty.

13. The method of claim 12, wherein the test value comprises all 0's.

14. A method of testing for faults in a FIFO, the FIFO configured to prevent read operations if the FIFO is empty, comprising:
(a) writing a test value to a first test address in the FIFO;
(b) writing the complement of the test value to a second test address after (a), wherein the second test address located one address behind the first test address;
(c) reading the value of the second test address, wherein reading the value of the second test address empties the FIFO;
(d) initiating a read operation at the first test address after (c); and (e) determining whether the FIFO executed the read operation in (d).

15. The method of claim 14, wherein (e) comprises determining whether the read operation in (d) returned the test value.

16. The method of claim 15, wherein the test value comprises all 1's.

17. A method of testing for faults in a FIFO, the FIFO including a write enable input signal that is asserted to permit write operations, comprising:
writing a test value to a test location in the FIFO, with the write enable signal asserted;
forming a complement of the test value;
initiating a write operation of the complement at one address higher than the test location, with the write enable signal deasserted;
performing a first read operation at the test location;
after the first read operation, performing a second read operation; and
determining whether the FIFO executed the second read operation.

18. The method of claim 17, wherein determining whether the FIFO executed the second read operation comprises determining whether the second read operation returned the test value or the complement.

19. The method of claim 18, wherein the test value comprises all 1's.

20. The method of claim 17, further including:
writing the complement at one address higher than the test location, with the write enable asserted;
initiating a third read operation with the read enable deasserted; and
determining whether the FIFO executed the third read operation.

21. The method of claim 20, wherein determining whether the FIFO executed the third read operation comprises determining whether the third read operation returned the test value or the complement.

22. A method of testing for faults in a pointer-based FIFO capable of relocating a read pointer in response to a retransmit command, comprising:
(a) writing a first test value to a first test location in the FIFO;
(b) complementing the test value to create a second test value;
(c) writing the second test value to a second test location in the FIFO after (a);
(d) reading the first test location after (a);
(e) reading the second test location after (c);
(f) issuing a retransmit command to the FIFO after (d) and (e);
(g) reading the first test location after (f); and
(h) based on the result of (g), determining whether the FIFO relocated the read pointer in response to the retransmit command.

23. The method of claim 22, wherein (h) comprises determining whether the result of (g) represents the first test value or the complement.

24. The method of claim 23, including executing (a)–(h) a plurality of times for each of a plurality of FIFO memory locations, wherein the second test location represents a different memory location during each of said plurality of times.

25. The method of claim 24, wherein the test value comprises all 0's.

26. The method of claim 23, further including:

(i) reading the second test location after (g);

(j) issuing a reset command after (i) to the FIFO to relocate the read pointer and a write pointer;

(k) writing the complement to the first test location after (j);

(l) writing the test value to the second test location after (k);

(m) reading the first test location after (l); and (n) based on the result of (m), determining whether the FIFO relocated a pointer in response to the reset command.

27. The method of claim 26, wherein (n) comprises determining whether the result of (m) represents the first test value or the complement.

28. The method of claim 27, wherein (n) comprises determining whether the FIFO relocated the write pointer.

29. The method of claim 27, wherein (n) comprises determining whether the FIFO relocated the read pointer.

30. The method of claim 27, including executing (a)–(n) a plurality of times for each of a plurality of FIFO memory locations, wherein the second test location represents a different memory location during each of said plurality of times.

31. A method of testing for faults in a pointer-based FIFO capable of relocating a read pointer and a write pointer in response to a reset command, comprising:

(a) writing a first test value to a first test location in the FIFO;

(b) complementing the test value to create a second test value;

(c) writing the second test value to a second test location in the FIFO after (a);

(d) reading the first test location after (a);

(e) reading the second test location after (c);

(f) sending a reset command to the FIFO after (d);

(g) writing the second test value to the first test location after (f);

(h) reading the first test location after (g); and (i) based on the result of (h), determining whether the FIFO relocated a pointer in response to the reset command.

32. The method of claim 31, wherein (i) comprises determining whether the read operation in (h) returned the second test value or the complement.

33. The method of claim 32, including executing (a)–(i) a plurality of times for each of a plurality of FIFO memory locations, wherein the second test location represents a different memory location during each of said plurality of times.

* * * * *